(12) United States Patent
Kodukula et al.

(10) Patent No.: US 11,107,181 B2
(45) Date of Patent: Aug. 31, 2021

(54) FIDELITY-DRIVEN RUNTIME THERMAL MANAGEMENT FOR NEAR-SENSOR ARCHITECTURES

(71) Applicants: Venkatesh Kodukula, Tempe, AZ (US); Saad Katrawala, Tempe, AZ (US); Britton Jones, Tempe, AZ (US); Robert LiKamWa, Tempe, AZ (US)

(72) Inventors: Venkatesh Kodukula, Tempe, AZ (US); Saad Katrawala, Tempe, AZ (US); Britton Jones, Tempe, AZ (US); Robert LiKamWa, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 16/684,735

(22) Filed: Nov. 15, 2019

(65) Prior Publication Data
US 2020/0160482 A1    May 21, 2020

Related U.S. Application Data

(60) Provisional application No. 62/767,599, filed on Nov. 15, 2018.

(51) Int. Cl.
*G06T 1/20* (2006.01)
*G06F 1/20* (2006.01)
(Continued)

(52) U.S. Cl.
CPC ............ *G06T 1/20* (2013.01); *G06F 1/206* (2013.01); *G06F 1/3296* (2013.01); *G06F 30/30* (2020.01)

(58) Field of Classification Search
CPC .......... G06T 1/20; G09G 5/363; G06F 1/206; G06F 1/3296; G06F 30/30
(Continued)

(56) References Cited

U.S. PATENT DOCUMENTS

| | | | |
|---|---|---|---|
| 6,624,816 B1* | 9/2003 | Jones, Jr. | G06F 1/3218 345/503 |
| 7,698,579 B2* | 4/2010 | Hendry | G06F 1/3218 713/300 |

(Continued)

OTHER PUBLICATIONS

Simonyan, K. et al., "Very Deep Convolutional Networks for Large-Scale Image Recognition," arXiv:1409.1556v5 [cs.CV], Dec. 23, 2014, 13 pages.
(Continued)

*Primary Examiner* — Jacinta M Crawford
(74) *Attorney, Agent, or Firm* — Withrow & Terranova, PLLC

(57) ABSTRACT

Fidelity-driven runtime thermal management for near-sensor architectures is provided. In this regard, a runtime controller is provided for controlling an operational mode of a vision or imaging system driven by fidelity demands. The runtime controller is responsible for guaranteeing the fidelity demands of a vision application and coordinating state transfer between operating modes to ensure a smooth transition. Under this approach, the vision application only needs to provide the runtime controller with high-level vision/imaging fidelity demands and when to trigger them. The runtime controller translates these demands into effective thermal management. To do this, the runtime controller applies application-specific requirements into appropriate policy parameters and activates temperature reduction mechanisms, such as clock gating and task offload. Furthermore, the runtime controller continuously adapts the policy (Continued)

parameters to situational settings, such as ambient temperature and ambient lighting, to meet ongoing fidelity demands.

19 Claims, 9 Drawing Sheets

(51) Int. Cl.
 G06F 1/3296 (2019.01)
 G06F 30/30 (2020.01)
(58) Field of Classification Search
 USPC .......................................... 345/501, 502, 503
 See application file for complete search history.

(56) References Cited

U.S. PATENT DOCUMENTS

| | | | | |
|---|---|---|---|---|
| 2008/0204460 | A1* | 8/2008 | Marinkovic | G06F 3/14 345/502 |
| 2009/0079746 | A1* | 3/2009 | Howard | H04N 21/4623 345/502 |
| 2010/0332799 | A1* | 12/2010 | Sonobe | G06F 1/206 712/43 |
| 2011/0164046 | A1* | 7/2011 | Niederauer | G06F 1/325 345/503 |
| 2012/0313952 | A1* | 12/2012 | Nakayama | G09G 5/363 345/502 |
| 2013/0106881 | A1* | 5/2013 | Hendry | G06T 1/20 345/522 |
| 2020/0105053 | A1 | 4/2020 | Prakash et al. | |
| 2020/0160750 | A1 | 5/2020 | LiKamWa et al. | |

OTHER PUBLICATIONS

Skadron, K. et al., "Control-Theoretic Techniques and Thermal-RC Modeling for Accurate and Localized Dynamic Thermal Management," Proceedings of the 8th International Symposium on High-Performance Computer Architecture (HPCA '02), 2002, IEEE Computer Society, 12 pages.

Szegedy, C. et al., "Going Deeper with Convolutions," Proceedings of the IEEE Conference on Computer Vision and Pattern Recognition, 2015, IEEE, 13 pages.

Yu, Y-J. et al., "Designing a Temperature Model to Understand the Thermal Challenges of Portable Computing Platforms," 17th IEEE ITHERM Conference, 2018, IEEE, 8 pages.

Zhang, C. et al., "Caffeine: Towards Uniformed Representation and Acceleration for Deep Convolutional Neural Networks," 2016 IEEE/ACM International Conference on Computer-Aided Design (ICCAD), Nov. 7-10, 2016, Austin, TX, IEEE, 8 pages.

Zhang, C. et al., "Optimizing FPGA-based Accelerator Design for Deep Convolutional Neural Networks," Proceedings of the 2015 ACM/SIGDA International Symposium on Field-Programmable Gate Arrays, Feb. 2015, ACM, pp. 161-170.

U.S. Appl. No. 16/898,791, filed Jun. 11, 2020.

Abadi, M. et al., "TensorFlow: A System for Large-Scale Machine Learning," Proceedings of the 12th USENIX Symposium on Operating System Design and Implementation (OSDI '16), Nov. 2-4, 2016, Savannah, GA, USENIX Association, pp. 265-283.

Amir, M. et al., "3D Stacked Image Sensor with Deep Neural Network Computation," 2018, IEEE SensorsJournal, vol. 18, No. 10, May 15, 2018, IEEE, pp. 4187-4199.

Author Unknown, "3D stacked image sensor," accessed Jul. 2020 from https://www.3dic.org/index.php?title=3D_stacked_image_sensor &oldid=1232, 5 pages.

Author Unknown, "3D stacked image sensor," Sep. 2018, https://web.archive.org/web/20180915034142/http://www.3dic.org/3D_stacked_image_sensor, 8 pages.

Author Unknown, "AR0330CM: 1/3-inch CMOS Digital Image Sensor," ON Semiconductor, Publication Order No. AR0330CM/D, Mar. 2017—Rev. 18, 2010, Semiconductor Components Industries, LLC, 53 pages.

Author Unknown, "Capra Raw Camera," Jun. 2018, http://webarchive.org/web/20180617171714/https://github.com/cucapra/CapraRawCamera, 1 page.

Author Unknown, "HLS based Deep Neural Network Accelerator Library for Xilinx Ultrascale+ MPSoCs," accessed Mar. 24, 2020 from https://github.com/Xilinx/CHaiDNN, 3 pages.

Author Unknown, "Imaging and Video," Microsemi, accessed Jan. 2018 from https://web.archive.org/web/20180110041800/https://www.microsemi.com/products/fpga-soc/imaging, 8 pages.

Author Unknown, "OpenVX Overview: Portable, Power-efficient Vision Processing," Oct. 2018, The Khronos Group, https://webarchive.org/web/20181030102106/https://khronos.org/openvx, 12 pages.

Author Unknown, "Power Efficiency," Xilinx Inc., 2018, https://web.archive.org/web/20180930115757/https://www.xilinx.com/products/technology/power.html, 20 pages.

Author Unknown, "System Power Calculator Information," Micron, accessed Oct. 2018 from • https://web.archive.org/web/20181025103725/https://www.micron.com/support/tools-and-utilities/power-calc, 6 pages.

Azarkhish, E. et al., "Neurostream: Scalable and Energy Efficient Deep Learning with Smart Memory Cubes," IEEE Transactions on Parallel and Distributed Systems, vol. 29, No. 2, Feb. 2018, IEEE, pp. 420-434.

Borkar, S., "Design Challenges of Technology Scaling," IEEE Micro, vol. 19, Issue 4, Jul.-Aug. 1999, IEEE, pp. 23-29.

Brooks, D. et al., "Dynamic Thermal Management for High-Performance Microprocessors," IEEE, 2001, pp. 171-182.

Cavigelli, L. et al., "Accelerating Real-Time Embedded Scene Labeling with Convolutional Networks," Proceedings of the 52nd Annual Design Automation Conference (DAC '15), Jun. 2015, ACM, 6 pages.

Chen, Y.-H. et al., "Eyeriss: A Spatial Architecture for Energy-Efficient Dataflow for Convolutional Neural Networks," 2016 ACM/IEEE 43rd Annual International Symposium on Computer Architecture, IEEE Computer Society, pp. 367-379.

Choi, J. et al., "An Energy/Illumination-Adaptive CMOS Image Sensor With Reconfigurable Modes of Operations," IEEE Journal of Solid-State Circuits, vol. 50, No. 6, Jun. 2015, IEEE, pp. 1438-1450.

Le Cun, Y. et al., "Handwritten Digit Recognition with a Back-Propagation Network," Advances in Neural Information Processing Systems 2 (NIPS), Jun. 1990, Neural Information Processing Systems Foundation, Inc., pp. 396-404.

Dodge, S. et al., "Understanding How Image Quality Affects Deep Neural Networks," 2016 Eighth International Conference on Quality of Multimedia Experience (QoMEX), Jun. 6-8, 2016, Lisbon, Portugal, IEEE, 6 pages.

Du, Z. et al., "ShiDianNao: Shifting Vision Processing Closer to the Sensor," 2015 ACM/IEEE 4nd Annual International Symposium on Computer Architecture (ISCA), Oct. 1, 2015, Portland, OR, IEEE, 13 pages.

Fontaine, R. et al., "Samsung Galaxy S9 Camera Teardown," Apr. 9, 2018, https://www.techinsights.com/blog/samsung-galxy-s9-camera-teardown, 3 pages.

Forchheimer, R. et al., "Near-Sensor Image Processing: A new Paradigm," IEEE Transactions on Image Processing, vol. 3, No. 6, Nov. 1994, IEEE, pp. 736-746.

Gabrielson, T.B., "Mechanical-Thermal Noise in Micromachined Acoustic and Vibration Sensors," IEEE Transactions on Electron Devices, vol. 40, No. 5, May 1993, IEEE, pp. 903-909.

Han, S. et al., "EIE: Efficient Inference Engine on Compressed Deep Neural Network," 2016 ACM/IEEE 43rd Annual International Symposium on Computer Architecture, 2016, IEEE, pp. 243-254.

Haruta, T. et al., "A 1/2.3inch 20Mpixel 3-Layer Stacked CMOS Image Sensor with DRAM," 2017 IEEE International Solid-State Circuits Conference (ISSCC 2017), Feb. 6, 2017, IEEE, pp. 76-78.

Jia, Y., "Caffe," Oct. 2018, https://webarchive.org/web/20181024220712/http://tutorial.caffe.berkeleyvision.org/performance_hardware.html, 1 page.

Jia, Y. et al., "Caffe: Convolutional Architecture for Fast Feature Embedding," Proceedings of the 22nd ACM International Conference on Multimedia (MM '14), Nov. 2014, ACM, pp. 675-678.

(56) References Cited

OTHER PUBLICATIONS

Kumagai, O. et al., "A 1/4-inch 3.9Mpixel Low-Power Event-Driven Back-Illuminated Stacked CMOS Image Sensor," 2018 IEEE International Solid-State Circuits Conference (ISSCC 2018), Feb. 12, 2018, IEEE, pp. 86-88.
Lee, K-W. et al., "Characterization of Chip-level Hetero-Integration Technology for High-Speed, Highly Parallel 3D-Stacked Image Processing System," 2012 International Electron Devices Meeting, Dec. 10-13, 2012, San Francisco, CA, IEEE, 4 pages.
Leland, R.P., "Mechanical-Thermal Noise in MEMS Gyroscopes," IEEE Sensors Journal, vol. 5, No. 3, Jun. 2005, IEEE, pp. 493-500.
Lie, D. et al., "Analysis of the Performance, Power, and Noise Characteristics of a CMOS Image Sensor With 3-D Integrated Image Compression Unit," IEEE Transactions on Components, Packaging and Manufacturing Technology, vol. 4, No. 2, Feb. 2014, pp. 198—On Components, Packaging and Manufacturing Technology, vol. 4, No. 2, Feb. 2014, pp. 198-208.
Likamwa, R. et al., "Energy Characterization and Optimization of Image Sensing Toward Continuous Mobile Vision," Proceeding of the 11th Annual International Conference on Mobile Systems, Applications, and Services (MobiSys '13), Jun. 25-28, 2013, Taipei, Taiwan, Association for Computing Machinery, pp. 69-81.
Likamwa, R. et al., "RedEye: Analog ConvNet Image Sensor Architecture for Continuous Mobile Vision," 2016 ACM/IEEE 43rd Annual International Symposium on Computer Architecture, IEEE Computer Society, pp. 255-266.
Lowe, D.G., "Object Recognition from Local Scale-Invariant Features," Proceedings of the 7th International Conference on Computer Vision, Sep. 20-27, 1999, Kerkyra, Greece, IEEE, 8 pages.
Mahmoud, M. et al., "IDEAL: Image Denoising AcceLerator," 2017 50th Annual IEEE/ACM International Symposium on Microarchitecture (MICRO), Oct. 14-17, 2017, Boston, MA, IEEE, pp. 82-95.
Milojicic, D. et al., "Process Migration," ACM Computing Surveys, vol. 32, No. 3, Sep. 2000, ACM, pp. 241-299.
Nose, A. et al., "Design and Performance of a 1 ms High-Speed Vision Chip with 3D-Stacked 140 GOPS Column-Parallel PEs †," Sensors, vol. 8, No. 1313, Apr. 2018, MDPI, 19 pages.
Pena, D. et al., "Benchmarking of CNNs for Low-Cost, Low-Power Robotics Applications," RSS 2017 Workshop: New Frontier for Deep Learning in Robotics, Jul. 2017, Boston, MA, 5 pages.
Pham, P-H. et al., "NeuFlow: Dataflow Vision Processing System-on-a-Chip," 2012 IEEE 55th International Midwest Symposium on Circuits and Systems (MWSCAS), Aug. 5-8, 2012, Boise, ID, IEEE, pp. 1044-1047.
Powell M. et al., "Heat-and-Run: Leveraging SMT and CMP to Manage Power Density Through the Operating System," 11th International Conference on Architectural Support for Programming Languages and Operating Systems (APLOS '04), Oct. 9-13, 2004, Boston, MA, ACM, pp. 260-270.
Qi, N. et al., "A Dual-Channel Compass/GPS/GLONASS/Galileo Reconfigurable GNSS Receiver in 65 nm CMOS With On-Chip I/Q Calibration," IEEE Transactions on Circuits and Systems—I: Regular Papers, vol. 59, No. 8, Aug. 2012, IEEE, pp. 1720-1732.
Redmon, J. et al., "YOLO9000: Better, Faster, Stronger," arXiv:1612.08242v1 [cs.CV], Dec. 25, 2016, 9 pages.
Rencz, M. et al., "Thermal Issues in Stacked Die Packages," 21st IEEE SEMI-THERM Symposium, 2005, IEEE, 6 pages.
Richmond, M. et al., "A New Process Migration Algorithm," ACM SIGOPS Operating Systems Review, 1997, pp. 31-42.
Salah, K., "Survey on 3D-ICs Thermal Modeling, Analysis,and Management Techniques," 2017 19th Electronics Packaging Technology Conference, IEEE, 4 pages.
Shi, Y. et al., "Smart Cameras: A Review," Citeseer Survey, 2005, 35 pages.
Simonyan, K. et al., "Very Deep Convolutional Networks for Large-Scale Image Recognition," arXiv:1409.1556v1 [cs.CV], Sep. 4, 2014, 10 pages.
Simonyan, K. et al., "Very Deep Convolutional Networks for Large-Scale Image Recognition," arXiv:1409.1556v2 [cs.CV], Sep. 15, 2014, 10 pages.
Simonyan, K. et al., "Very Deep Convolutional Networks for Large-Scale Image Recognition," arXiv:1409.1556v3 [cs.CV], Nov. 18, 2014, 12 pages.
Simonyan, K. et al., "Very Deep Convolutional Networks for Large-Scale Image Recognition," arXiv:1409.1556v4 [cs.CV], Dec. 19, 2014, 13 pages.

* cited by examiner

FIDELITY-DRIVEN RUNTIME THERMAL MANAGEMENT FOR NEAR-SENSOR ARCHITECTURES

RELATED APPLICATIONS

This application claims the benefit of provisional patent application Ser. No. 62/767,599, filed Nov. 15, 2018, the disclosure of which is hereby incorporated herein by reference in its entirety.

GOVERNMENT SUPPORT

This invention was made with government support under 1657602 awarded by the National Science Foundation. The government has certain rights in the invention.

FIELD OF THE DISCLOSURE

The present disclosure relates to imaging and vision systems and in particular to imaging and vision systems having near-sensor architectures.

BACKGROUND

Imaging and vision systems allow computing systems to sense and react to real-world situations and to capture images for human consumption. This affords a range of utilities on many devices spanning a wide variety of power profiles, including smartphones and tablets, wearable headsets, personal computers, security cameras, drones, automobiles, and security and monitoring systems. Unfortunately, imaging requires high data rates to transfer pixel data from the image sensor to computational units.

FIG. 1A is a schematic diagram of a traditional vision system 10. In such a traditional vision system 10, computational units 12 are separated from a sensor element 14 via long interconnects 16 (e.g., ribbon cables), yielding data rates which create bottlenecks to energy efficiency and processing. Thus, the traditional vision system 10 results in power profiles on the order of multiple watts (W). For example, it has been shown that a state-of-the-art convolutional neural network needs at least 1 W of processing power to process low resolution quarter video graphics array (QVGA) frames at 30 frames per second (fps) using the traditional vision system 10. For high performance processing at high resolutions and framerates, the power requirements rapidly rise, easily going up to over 10 W of processing power on mobile-based implementations.

This power consumption has motivated a trend towards three-dimensional "stacked" integrated circuit architectures for sensor capture and processing, also referred to as near sensor processing. FIG. 1B is a schematic diagram of a near-sensor vision system 18. A three-dimensional (3D) stacked vision sensor 20 stacks the sensor element 14, vision processing unit (VPU) 22, and memory 24 on top of each other in the same package. By processing data near the sensor element 14, various proposed and implemented systems can achieve energy-efficient vision processing, as well as bursts of high-speed capture. With advances in fabrication, 3D stacked vision sensors 20 have been commercially released since 2012, and are still under active development for high performance and efficiency.

Unfortunately, sensitivity of the sensor element 14 to temperature prevents a full adoption of near-sensor processing, creating noise in captured images. Furthermore, low light environments force the sensor element 14 to operate at high exposure and ISO to capture the scene, which increases a vulnerability of the sensor element 14 to noise. Despite a plethora of central processing unit (CPU) dynamic thermal management (DTM) mechanisms, current techniques do not suffice imaging requirements; traditional DTM reduces package cooling costs and maintains maximum temperature limits (e.g., thermal design power (TDP)), turning a blind eye to the transient imaging needs of near-sensor processing. Thus, despite performance and energy benefits of near-sensor processing, the temperature profile of visual computing limits stacked architectures in many situations.

SUMMARY

Embodiments described herein include fidelity-driven runtime thermal management for near-sensor architectures. Vision processing on traditional architectures is inefficient due to energy-expensive off-chip data movements. Many researchers advocate pushing processing close to the sensor to substantially reduce data movements. However, continuous near-sensor processing raises the sensor temperature, impairing the fidelity of imaging/vision tasks. This disclosure characterizes the thermal implications of using three-dimensional (3D) stacked image sensors with near-sensor vision processing units (VPUs). The characterization reveals that near-sensor processing reduces system power but degrades image quality.

For reasonable image fidelity, the sensor temperature needs to stay below a threshold, situationally determined by application needs. Fortunately, the characterization also identifies opportunities—unique to the needs of near-sensor processing—to regulate temperature based on dynamic visual task requirements and rapidly increase capture quality on demand. Based on the characterization, this disclosure proposes and investigates two thermal management control policies—stop-capture-go and seasonal migration—for imaging-aware thermal management. This disclosure presents parameters that govern the policy decisions and explores the trade-offs between system power and policy overhead. An evaluation shows that novel dynamic thermal management strategies can unlock the energy-efficiency potential of near-sensor processing with minimal performance impact, without compromising image fidelity.

In this regard, embodiments disclosed herein provide a runtime controller for controlling an operational mode of a vision or imaging system driven by fidelity demands. The runtime controller is responsible for guaranteeing the fidelity demands of a vision application and coordinating state transfer between operating modes to ensure a smooth transition. Under this approach, the vision application only needs to provide the runtime controller with high-level vision/imaging fidelity demands and when to trigger them. The runtime controller translates these demands into effective thermal management. To do this, the runtime controller applies application-specific requirements into appropriate policy parameters and activates temperature reduction mechanisms, such as clock gating and task offload. Furthermore, the runtime controller continuously adapts the policy parameters to situational settings, such as ambient temperature and ambient lighting, to meet ongoing fidelity demands.

An exemplary embodiment provides a vision system. The vision system includes a stacked vision sensor operable in a capture (CAP) mode and a near-sensor processing (NSP) mode. The vision system further includes a runtime controller coupled to the stacked vision sensor. The runtime controller is configured to receive an image fidelity constraint from a vision application and cycle the stacked vision sensor between the CAP mode and the NSP mode based on the image fidelity constraint.

Another exemplary embodiment provides a method for thermally managing a vision system. The method includes receiving an indication of operating temperature for a stacked vision sensor. The method further includes transitioning the stacked vision sensor between a CAP mode and an NSP mode based on the operating temperature and an image fidelity constraint for the stacked vision sensor.

Another exemplary embodiment provides vision circuitry. The vision circuitry includes a stacked vision sensor, which includes a sensor element and a VPU. The vision circuitry further includes a runtime controller coupled to the stacked vision sensor and configured to dynamically manage a temperature of the stacked vision sensor by selectively offloading image processing from the VPU to a remote processing unit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
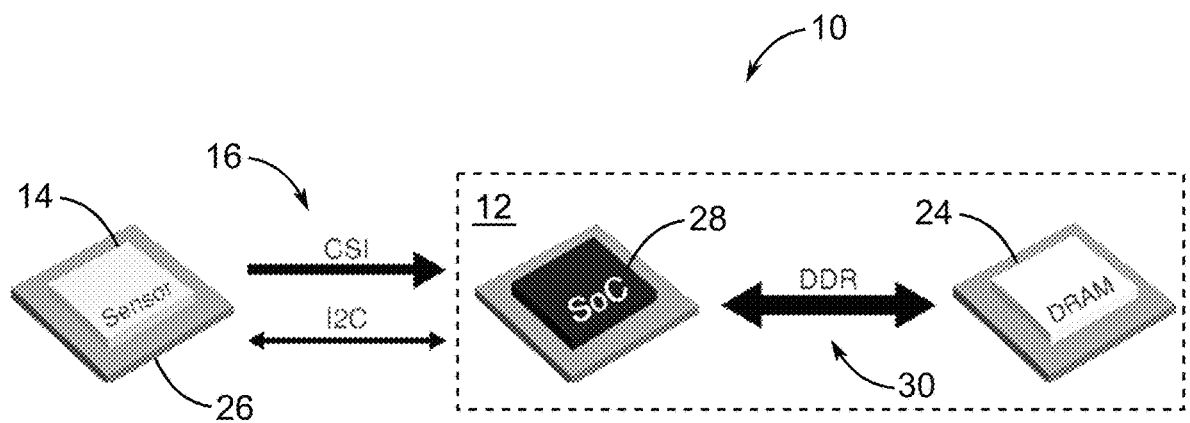
FIG. 1A is a schematic diagram of a traditional vision system.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments described herein include fidelity-driven runtime thermal management for near-sensor architectures. Vision processing on traditional architectures is inefficient due to energy-expensive off-chip data movements. Many researchers advocate pushing processing close to the sensor to substantially reduce data movements. However, continuous near-sensor processing raises the sensor temperature, impairing the fidelity of imaging/vision tasks. This disclosure characterizes the thermal implications of using three-dimensional (3D) stacked image sensors with near-sensor vision processing units (VPUs). The characterization reveals that near-sensor processing reduces system power but degrades image quality. For reasonable image fidelity, the sensor temperature needs to stay below a threshold, situationally determined by application needs. Fortunately, the characterization also identifies opportunities—unique to the needs of near-sensor processing—to regulate temperature based on dynamic visual task requirements and rapidly increase capture quality on demand. Based on the characterization, this disclosure proposes and investigates two thermal management control policies—stop-capture-go and seasonal migration—for imaging-aware thermal management. This disclosure presents parameters that govern the policy decisions and explores the trade-offs between system power and policy overhead. An evaluation shows that novel dynamic thermal management strategies can unlock the energy-efficiency potential of near-sensor processing with minimal performance impact, without compromising image fidelity.

In this regard, embodiments disclosed herein provide a runtime controller for controlling an operational mode of a vision or imaging system driven by fidelity demands. The runtime controller is responsible for guaranteeing the fidelity demands of a vision application and coordinating state transfer between operating modes to ensure a smooth transition. Under this approach, the vision application only needs to provide the runtime controller with high-level vision/imaging fidelity demands and when to trigger them. The runtime controller translates these demands into effective thermal management. To do this, the runtime controller applies application-specific requirements into appropriate policy parameters and activates temperature reduction mechanisms, such as clock gating and task offload. Furthermore, the runtime controller continuously adapts the policy parameters to situational settings, such as ambient temperature and ambient lighting, to meet ongoing fidelity demands.

As described further below with respect to FIGS. 2A-5, the thermal implications of using 3D stacked image sensors with near-sensor VPUs are characterized. In addition to confirming and modeling relationships between near-sensor processing power and sensor temperature, the characterization reveals a consequential insight: despite the long time constants for the sensor to settle to steady-state temperatures, removing near-sensor power from image capture systems results in an immediate and dramatic reduction in transient junction temperature of the sensor. For example, for a 2.5 watt (W) system, the sensor temperature drops by 13° C. in 20 milliseconds (ms), when the processing is turned off. This stems from the high thermal capacitance of chip packaging and low thermal capacitance of the die. This immediate temperature drop is neglected by existing dynamic thermal management approaches, whose primary aim is to confine chip temperature below an emergency limit. However, as reducing transient temperature raises sensing fidelity, this observation allows on-demand high-fidelity capture.

With respect to FIGS. 6 and 7 below, imaging-specific control policies for thermal management are described which build on characterized challenges and opportunities. Two exemplary thermal management control policies are described—stop-capture-go and seasonal migration—for effective near-sensor vision processing that minimizes system energy consumption and affords performance computation and high fidelity capture. Stop-capture-go suspends the processing briefly to allow for a high fidelity capture and resumes the processing after the capture. On the other hand, seasonal migration occasionally shifts processing to a thermally isolated far-sensor processing unit for high fidelity capture. A runtime controller (also referred to herein as Stagioni) is described which orchestrates the temperature management for near-sensor processing.

An exemplary embodiment of the disclosure is further described with respect to FIGS. 8A-8B below. The effectiveness of the control policies are evaluated for managing sensor temperature to suit imaging needs with respect to FIGS. 9A-10B below. The robustness of exemplary embodiments in smoothly handling the dynamic fidelity needs is also demonstrated.

Enabling high performance and high efficiency near-sensor processing with the embodiments described herein can unlock the potential for several vision/imaging applications, including sophisticated dashboard cameras, continuous augmented reality tracking, and other futuristic use cases. Throughout this disclosure, the implications of near-sensor processing are studied and the policies are evaluated around a lifelogger case study, in which a wearable lifelogger device chronicles important events and objects in a user's life. The life-logger device runs object detection and tracking algorithms to continuously determine objects in a scene surrounding the user and track those objects. Meanwhile, the life-logger device performs occasional captures upon detecting any important event (e.g., a person entering the scene). This can form the basis for personalized real-world search engines, and assist those with memory impairments or visual impairments.

With reference to FIGS. 2A-5, the thermal implications of using 3D stacked vision sensors 20 with near-sensor VPUs 22 are characterized. In particular, the relationship of near-sensor processing with system energy, sensor element 14 temperature, and image noise is studied. The studies confirm that near-sensor processing minimizes off-chip data movements, thereby substantially reducing system power. With near-sensor processing in this case study, the system power of residual neural network (ResNet)-based classification can be reduced by 36%.

In addition, near-sensor processing power is related to image fidelity through temperature simulation, confirming that image fidelity degrades over time with additional near-sensor processing power. However, it is also observed that removal of near-sensor processing power favorably leads to rapid drops in sensor element 14 temperature, reducing sensor element 14 temperature by 13° C. in 20 milliseconds (ms). This observation can be exploited to allow the sensor to operate at higher temperatures and lower image fidelities for energy-efficient vision (e.g., continuous object detection), while immediately switching to low temperature operation for high-fidelity image capture when an application needs high quality imaging (e.g., photographing a particular object).

As described above with respect to FIGS. 1A and 1B, near-sensor processing reduces energy-expensive data movement across the lengthy interconnects between different chips. The traditional vision system 10 of FIG. 1A includes a pipeline operating across chips to connect a variety of subsystems: a camera chip 26 (including the sensor element 14), a processing unit (e.g., a system-on-chip (SoC) 28), and memory 24. The camera chip 26 connects to processing units on the SoC 28 through interconnects 16, such as a standard camera serial interface (CSI) for data transfer and an inter-integrated circuit (I2C) interface for control and configuration. Meanwhile, the SoC 28 uses the memory 24, such as dynamic random-access memory (DRAM), through an external interface 30 (e.g., a double data rate (DDR) interface) to buffer image frames for processing.

Using regression models on measurements and reported values, a coarse energy profile model is constructed to motivate the need for near-sensor processing. As shown in Table 1, sensing, processing, and storage consume energy on the order of 100s of picojoules (pJ) per pixel. On the other hand, communication interfaces draw more than 3 nanojoules (nJ) per pixel.

TABLE 1

Energy-per-pixel of various components in the traditional vision pipeline. Communication cost is atleast an order of magnitude more than other costs.

| Component | Energy (pJ/pixel) |
| --- | --- |
| Sensing | 595 |
| Communication (Sensor - SoC) | 900 |
| Communication (SoC - DRAM) | 2800 |
| Storage (Read) | 283 |
| Storage (Write) | 394 |

Sensing requires an energy of 595 pJ/pixel, mostly drawn from three components: pixel array, read-out circuits, and analog signal chain, which consume 25 pJ/pixel, 43 pJ/pixel, and 527 pJ/pixel, respectively. DRAM storage on standard mobile-class memory chips (e.g., 8 Gb, 32-bit LPDDR4) draws 677 pJ/pixel for writing and reading a pixel value. This roughly divides into 283 pJ/pixel for reading and 394 pJ/pixel for writing. Communication over CSI and DDR interfaces incur 3.7 nJ/pixel, mostly due to operational amplifiers on both transmitter and receiver. The interface power consumption is measured on 4-lane CSI interfaces and LPDDR4 interfaces by inputting several data rates. From this information, a linear-regression model is constructed to estimate the energy per pixel to be 0.9 nJ/pixel over CSI and 2.8 nJ/pixel over DDR. For computation, reported power consumptions of various convolutional neural network (ConvNet) architectures are gathered from the literature.

For example, when operating at full high definition (HD) (1920×1080) at 30 frames per second (fps), and using residual neural network (ResNet) for inference on the SoC 28 at 30 fps, a modeled traditional vision system 10 uses 4 W of power. On the other hand, increasing the framerate to 60 fps demands 10 W of power on a field programmable gate array (FPGA). It should be understood that this energy model provides coarse estimation; actual numbers may depend on architectural decisions, patterns of execution, and several other factors. For further examples, Table 3 below compares power estimates of several example systems with embodiments of the present disclosure.

Figure 1B:
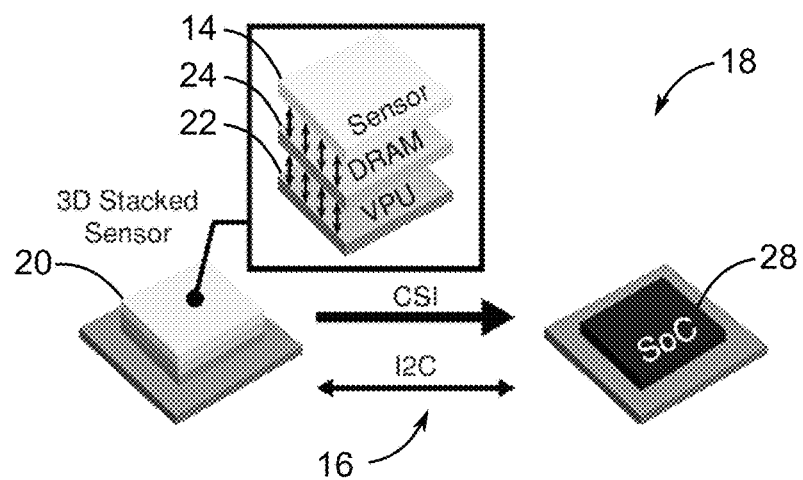
FIG. 1B is a schematic diagram of a near-sensor vision system.

With reference to FIG. 1B, on-chip data movement is known to be significantly more efficient than off-chip data movement by six orders of magnitude. The near-sensor vision system 18 leverages this insight for energy-efficiency gains. Near-sensor processing moves the memory 24 into the 3D stacked vision sensor 20 to eliminate offchip DDR movement, and moves the VPU 22 into the 3D stacked vision sensor 20 to reduce the CSI interface data rate. Thus, the output of the 3D stacked vision sensor 20 can be reduced from a few megabytes (MB) to a few bytes. This information can be sent across efficient low data rate interconnects 16 (e.g., I2C). Altogether, when applying these energy profile models to the processing pipeline of the near-sensor vision system 18, a full HD near-sensor vision system 18 consumes 2.5 W, thereby yielding 36% savings over traditional architectures.

Figure 2A:
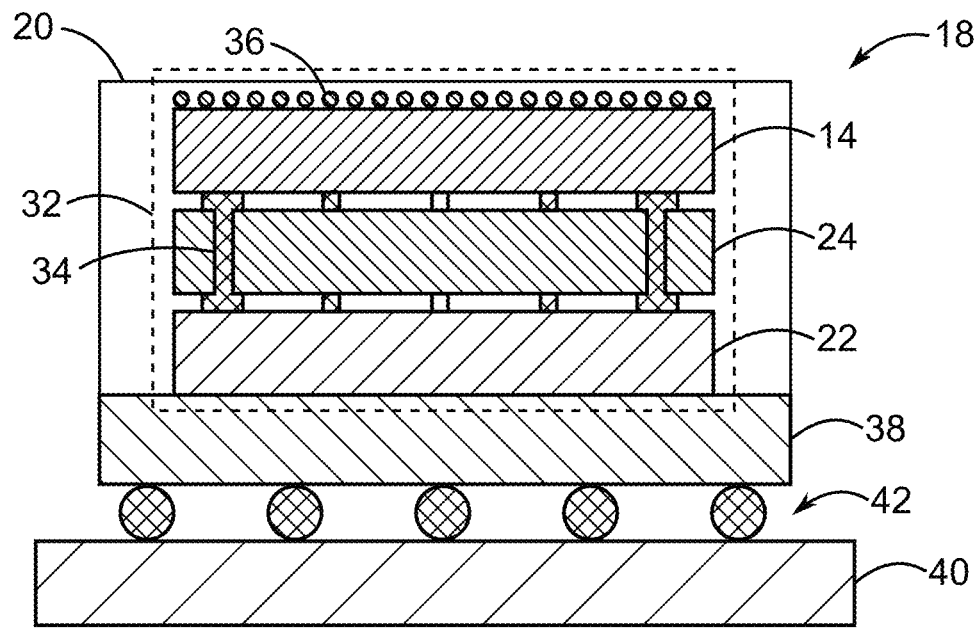
FIG. 2A is a schematic diagram of an exemplary three dimensional (3D) stacked vision sensor package.

FIG. 2A is a schematic diagram of an exemplary 3D stacked vision sensor 20 package. The 3D stacked vision sensor 20 can be implemented in the near-sensor vision system 18 of FIG. 1B. Inside the 3D stacked vision sensor 20 package, a stack 32 includes sensor element 14, memory 24, and VPU 22 layers stacked on top of each other (e.g., with the sensor element 14 over the memory 24, and the memory 24 over the VPU 22). The sensor element 14, memory 24, and VPU 22 can be connected to each other using through-silicon vias (TSVs) 34. The top of the stack 32 opens to the surroundings through microlenses 36, while the bottom of the stack 32 sits on a substrate 38 that opens to a circuit assembly 40. The circuit assembly 40 can be a printed circuit board (PCB), and can connect to components of the stack 32 through solder balls 42 or another conductive element.

Though tight integration yields energy-efficiency and performance benefits, near-sensor processing in the 3D stacked vision sensor 20 generates heat at the sensor element 14 through thermal coupling between the tightly integrated components of the stack 32. Dynamic thermal management for many processors, such as a central processing unit (CPU), is only concerned with keeping the maximum temperature below a thermal design power (TDP), but embodiments disclosed herein give close attention to temperature patterns, as the transient temperature affects image fidelity.

Figure 2B:
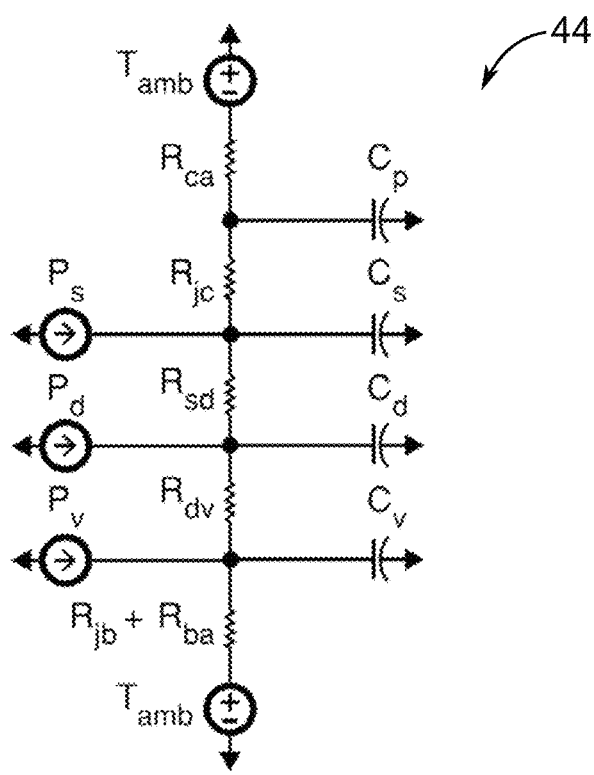
FIG. 2B is a schematic diagram of an equivalent thermal resistance-capacitance (RC) model of the 3D stacked vision sensor package of FIG. 2A.

FIG. 2B is a schematic diagram of an equivalent thermal resistance-capacitance (RC) model 44 of the 3D stacked vision 20 sensor package of FIG. 2A. Conduction is the dominant heat transfer mechanism in integrated circuits. Mobile class image sensors, such as the 3D stacked vision sensor 20, omit heat sinks or cooling fans, due to their size, weight, and placement challenges. The sensor element 14, memory 24, and VPU 22 consume power when active, which dissipates as heat. To model temperature dynamics, thermal RC modeling techniques are used to determine the thermal characteristics of the 3D stacked vision sensor 20. Vertical heat transfer is primarily considered; vertical resistances are several orders of magnitude smaller than the lateral resistances of convective heat transfer. Component values of the layers are obtained through a mixture of analytical and empirical approaches.

Table 2 shows different RC component values derived for the thermal RC model 44. Previous works report layer dimension values of typical 3D stacked vision sensors 20. In these works, the layer thickness ranges in the order of a few microns to 10s of microns, while the layer's area ranges from 10 s of mm$^2$ to 100s of mm$^2$. The international technology roadmap for semiconductors (ITRS) provides layer dimensions and material property constants ρ and c to define the guidelines for semiconductor fabrication. From these, the thermal resistance can be derived as R=ρt/A and thermal capacitance as C=ctA where A is the layer's cross sectional area and t is the thickness.

Package capacitance can be deduced empirically by observing the temperature trace of an image sensor chip while subjecting the sensor element 14 to thermal stress. Regression models are constructed from the temperature trace of an OnSemi AR0330 smartphone-class image sensor to derive package capacitance, as an example. Finally, termination thermal resistance depends on the type of casing and board properties. Sensor companies make these values available through datasheets. Such provided values for typical packages are used directly in this model.

TABLE 2

Thermal resistance and capacitance values of different components in RC model of stack.

| Component | R (K/W) | Layer | C (J/K) |
| --- | --- | --- | --- |
| $R_{ca}$: Case-to-Ambient | 56 | $C_p$: Package | 1 |
| $R_{jc}$: Junction-to-Case | 6 | $C_s$: Sensor | 0.65 m |
| $R_{sd}$: Sensor-to-DRAM | 0.6 | $C_d$: DRAM | 0.65 m |
| $R_{dv}$: DRAM-to-VPU | 0.6 | $C_v$: VPU | 0.65 m |
| $R_{jb}$: Junction-to-Board | 40 | | |
| $R_{ba}$: Board-to-Ambient | 14 | | |

It should be noted that off-sensor power generally does not affect sensor element 14 temperature. While processing far from the sensor element 14, the off-sensor SoC 28 components of FIG. 1B do not influence the sensor element 14 temperature. Even in tightly integrated mobile systems, (e.g., smartphones) the sensor element 14 and the SoC 28 reside on two different boards and communicate over a ribbon cable (e.g., the interconnect 16). As a result, the sensor element 14 and the SoC 28 are nearly in thermal isolation. That is, any increase in temperature of one component will not cause appreciable change in temperature of the other. This effect is verified by running a CPU-bound workload on the SoC 28 on a smartphone while keeping the camera idle. The instruments do not report any rise in sensor element 14 temperature with rise in SoC 28 temperature. Thus, in the study, thermal coupling effects from off-sensor components are not considered.

Figure 3A:
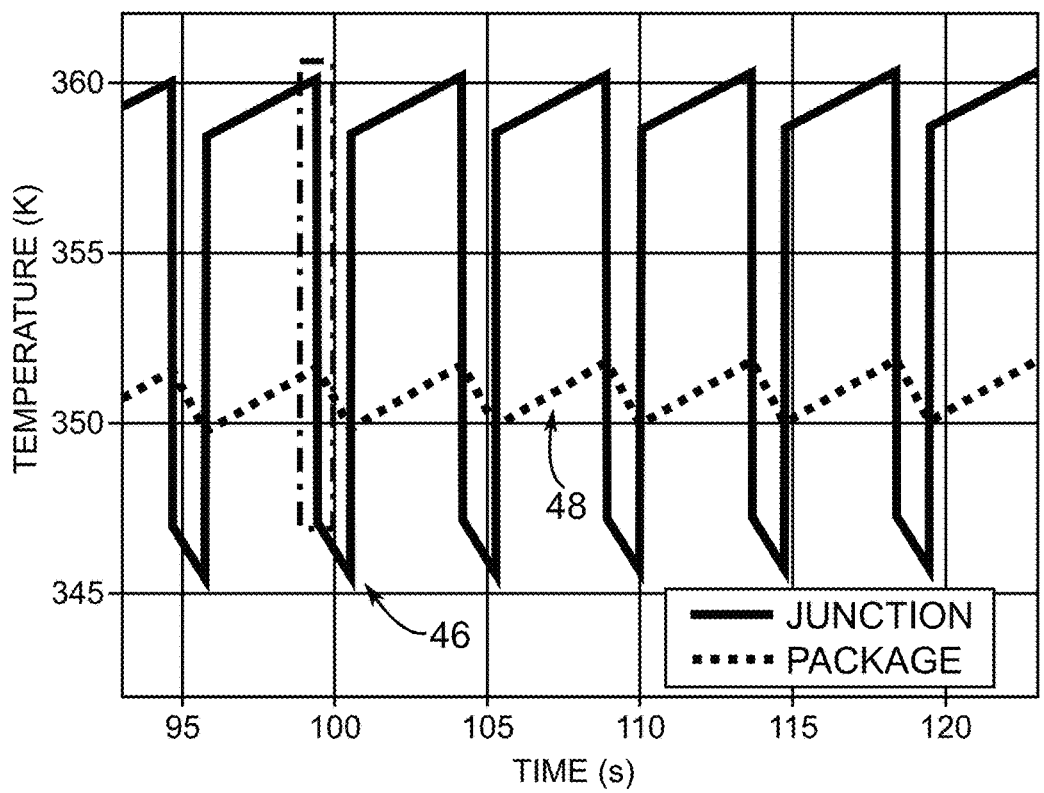
FIG. 3A is a graphical representation of temperature measurements of the sensor element junction and the 3D stacked vision sensor package of FIGS. 2A and 2B due to near-sensor power consumption.

FIG. 3A is a graphical representation of temperature measurements of the sensor element 14 junction and the 3D stacked vision sensor 20 package of FIGS. 2A-2B due to near-sensor power consumption. Through simulation on the RC model 44, the thermal behavior of near-sensor processing architectures is estimated. Temperature profiles are evaluated as the 3D stacked vision sensor 20 operates in two different modes: near-sensor processing (NSP) mode, in which power consumptions are representative of capturing image frames and processing vision workloads near the sensor element 14, and capture (CAP) mode, in which power consumptions are representative of capturing image frames and transmitting frames to a remote processing unit (e.g., the SoC 28). With various execution patterns, the thermal behavior of the sensor element 14 can be simulated as the 3D stacked vision sensor 20 operates among different sensor modes.

Previous analysis has reported that spatial variations in temperature can be safely ignored if the chip power density is within 20 W/cm$^2$, as is the case in NSP mode. Power density, which is the power dissipated over chip area, measures the degree of spatial non-uniformities in temperature. The physical dimensions of the 3D stacked vision sensor 20 combined with the power profile of the case study results in a power density of 16 W/cm$^2$. Therefore, the spatial variations of temperature inside the stack are not considered for modeling near-sensor processing architectures.

Steady-State Temperature:

Inter-layer resistances are at least two orders of magnitude smaller than termination resistances. This results in negligible drop across the resistor, leading to minuscule temperature gradients among a layer. For example, for 1 W of VPU 22 power, the sensor element 14, the memory 24, and the VPU 22 will be at 60.7° C., 60.9° C., and 61.0° C., respectively. Thus, the layers can be combined and the temperature of the sensor element 14 can be treated as a single junction. Consequently, termination resistance largely influences the sensor element 14 junction's steady-state temperature.

In addition to resistances, power consumption plays a crucial role in deciding steady-state. High power dissipates more heat in the physical structures resulting in a hotter sensor element 14 junction. Conversely, low power consumption relieves the heat generation, allowing for a drop in steady-state temperature. Reducing near-sensor power consumption from 1 W to 100 mW results in a temperature drop of 5° C. Finally, a higher ambient temperature leads to raised steady state temperatures.

Transient temperature:

Thermal dynamic time constants govern the transient temperature of the 3D stacked vision sensor 20. As chip package capacitance is several orders of magnitude greater than die capacitance, the chip package time constant dominates the time constant of the overall approach to steady-state temperature, taking 10s of seconds to reach a steady state temperature. This allows dynamic temperature management policies ample time to form decisions, e.g., altering steady state temperature by changing near-sensor power draw.

As illustrated in FIG. 3A, near-sensor power consumption raises a transient temperature 46 of the sensor element 14 die above a package temperature 48. This is because the heat source is on the sensor element 14 die itself, dissipating heat through the package into the ambient environment. Consequently, reducing power consumption rapidly reduces the gap between the sensor element 14 die transient temperature 46 and the package temperature 48. The speed of this drop is governed by the sensor element 14 junction die time constant, which is on the order of milliseconds.

Figure 3B:
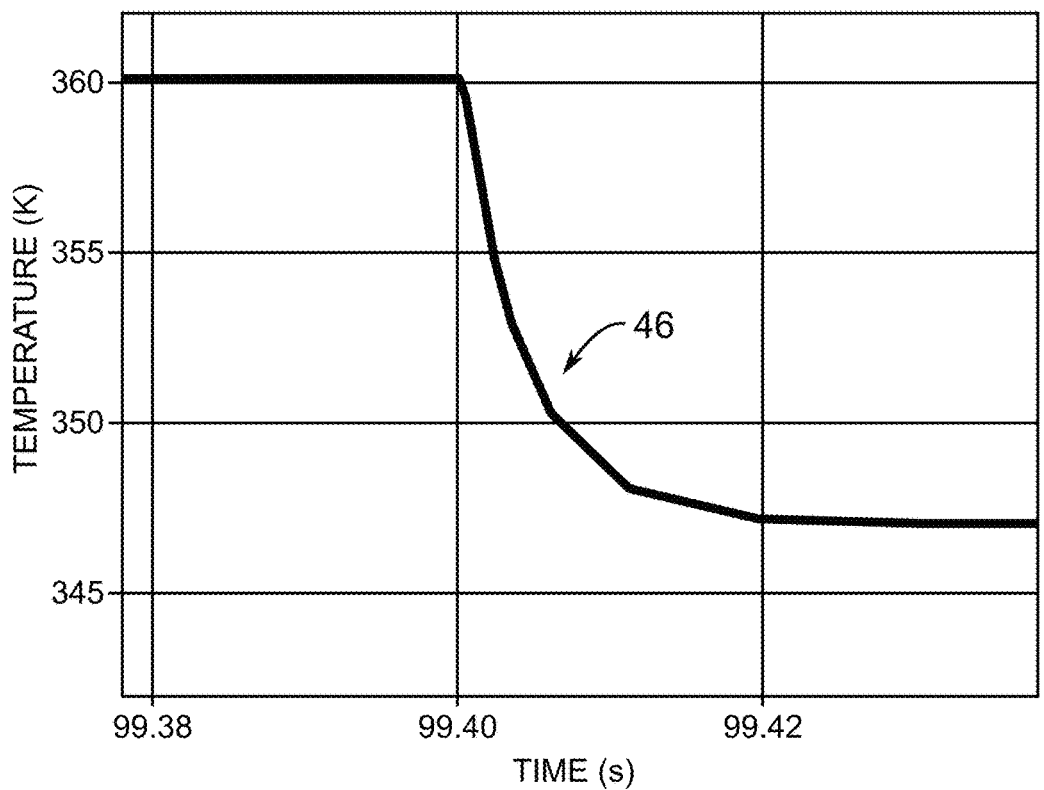
FIG. 3B is an expanded view of the graphical representation of FIG. 3A, further illustrating a temperature drop due to reduced power consumption.

FIG. 3B is an expanded view of the graphical representation of FIG. 3A, further illustrating the temperature drop due to reduced power consumption. Because the transient temperature 46 affects image fidelity, rapid temperature drops—such as the charted 13° C. drop in 20 ms—provide unique opportunities for dynamic thermal management for on-demand image sensor fidelity. This is discussed in more detail below with respect to FIGS. 6 and 7.

Figure 4:
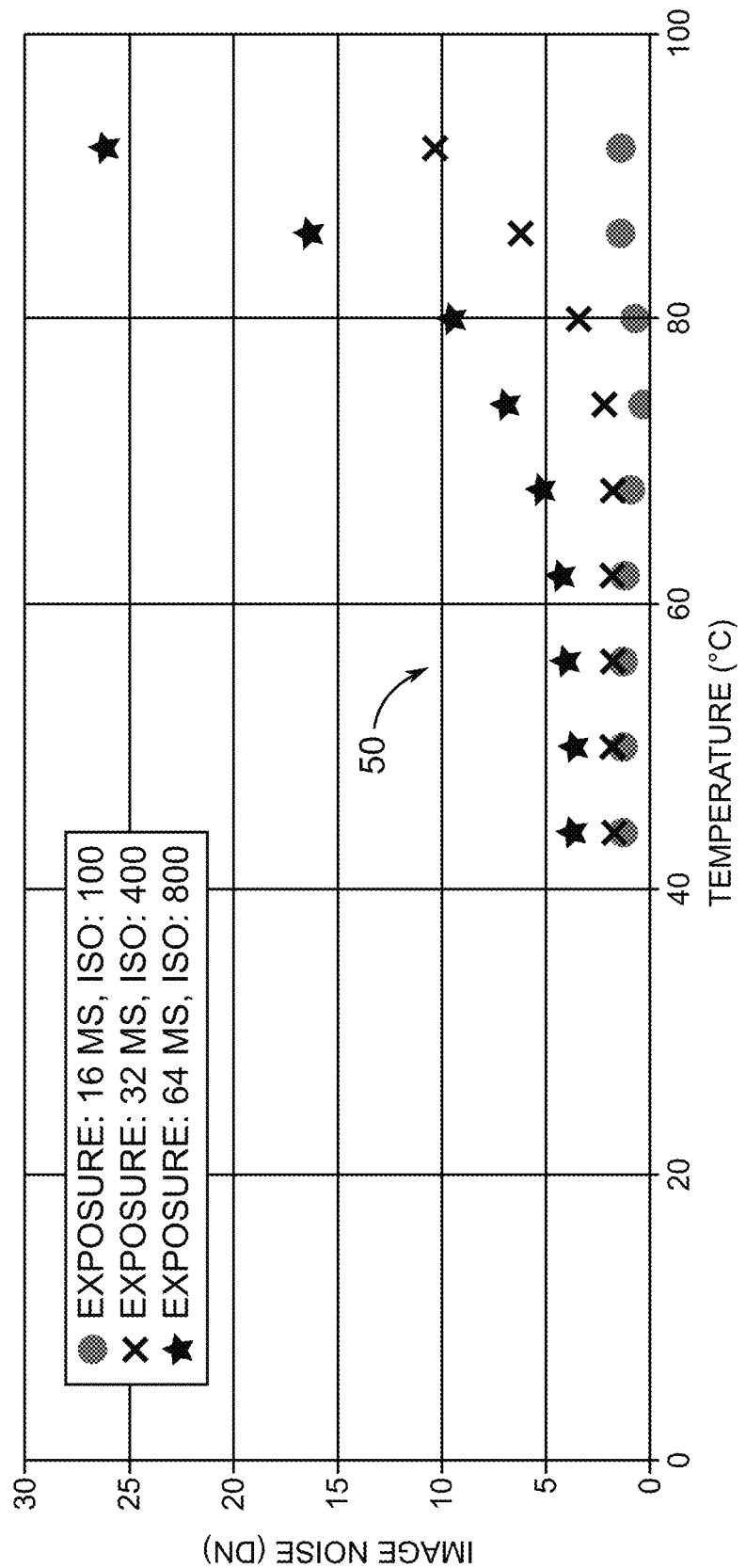
FIG. 4 is a graphical representation of a thermal characterization of an example sensor element, illustrating noise sensitivity to temperature, exposure, and ISO.

FIG. 4 is a graphical representation of a thermal characterization 50 of an example sensor element 14, illustrating noise sensitivity to temperature, exposure, and ISO. While raised temperatures cause reliability and packaging issues for integrated circuits, they introduce another problem for image sensors: noise. The influence of noise on vision tasks has been widely reported. It has been found that neural networks have difficulty predicting semantics of an image when challenged by different types of image noise. Similar findings indicate that image classification accuracy generally degrades with increase in temperature/noise. Thus, reliable vision demands images of reasonable fidelity.

Images for human consumption further raise the fidelity bar for imaging needs; high fidelity is often needed in many real-life scenarios. For example, if a set of dashcam images is to be used in an auto insurance claim, the images need to have superior quality to obtain maximal information to make decisions on benefits. While denoising can help mitigate fidelity issues, denoising algorithms often create imaging artifacts which can also impair perceived image quality. Thus, as images are required to accurately represent the real physical world, imaging fidelity needs are even more stringent than other vision-based needs.

The sources of image noise are theoretically well understood. However, to understand the practical relationship between temperature and image quality on commercial sensors, the thermal characterization 50 is performed on the sensor element 14, in this example a 3 megapixel (MP) OnSemi AR0330 sensor connected to a Microsemi SmartFusion2 FPGA. The AR0330 sensor includes noise correction stages inside the sensor, as is common in commercial sensors. A heat gun is used to raise the sensor element 14 temperature and capture raw images in a dark room setting while the sensor element 14 temperature is monitored with a FLIR One thermal camera.

FIG. 4 charts a trend: sensor elements 14 are particularly susceptible to noise above a particular temperature value. This is despite the presence of noise correction stages inside the sensor. The correction blocks could bring the noise under control but only for lower temperature settings. For high temperatures, the denoising appears to fail to exercise control on noise minimization. Notably, this knee shifts with exposure and analog gain settings, presumably due to noise amplification. For instance, at high exposure and high analog gain, which correspond to low light situations, sensor elements 14 start to become thermally sensitive even at low temperatures, e.g., 52° C. To adapt to all experienced conditions, the thermal management of the 3D stacked vision sensor 20 should be adaptive to the varying needs of different lighting conditions.

Figure 5A:
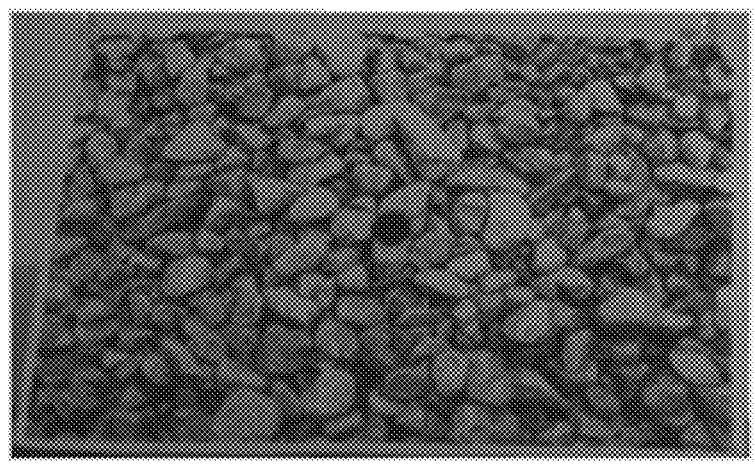
FIG. 5A is an image of a scene captured with the sensor element of FIGS. 2A and 2B at 44° C.
Figure 5B:
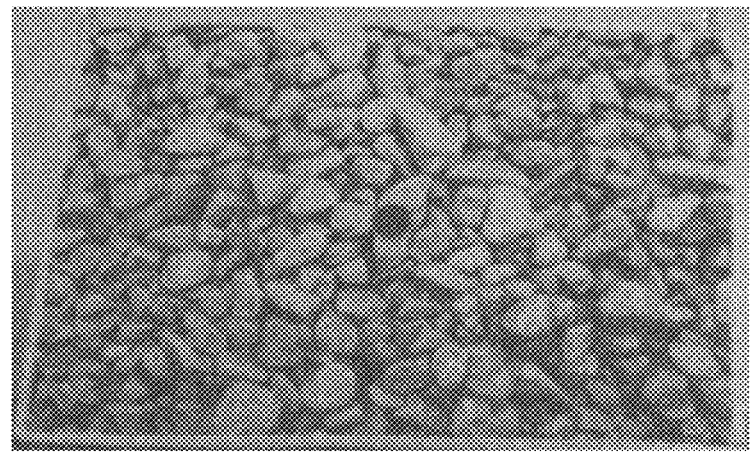
FIG. 5B is an image of the scene of FIG. 5A captured with the sensor element of FIGS. 2A and 2B at 92° C.

Thermal noise is visibly apparent on images, whether in low light or bright light conditions. For example, FIG. 5A is an image of a scene 52 captured with the sensor element 14 at 44° C. FIG. 5B is an image of the scene 52 of FIG. 5A captured with the sensor element 14 at 92° C. Each of these images was captured under daylight conditions at the respective sensor element 14 temperatures. Graininess in the hotter image of FIG. 5B can be observed due to the strong influence of noise.

Figure 5C:
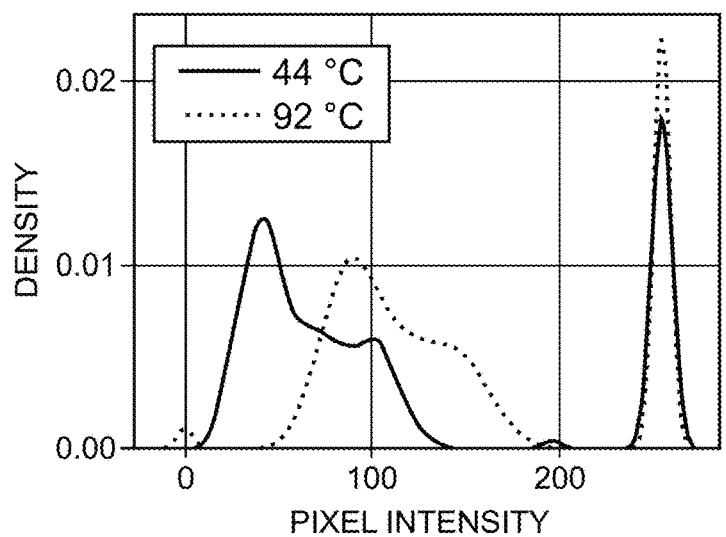
FIG. 5C is a graphical representation of histograms for the images of FIGS. 5A and 5B.

FIG. 5C is a graphical representation of histograms for the images of FIGS. 5A and 5B. Paired with the noisy images, the histograms represent the pixel intensity distribution of an image. The wider peaks in the distribution signify the variance of pixel intensity, while the mean of the peaks represent average pixel intensity. The histogram of the hotter image (e.g., FIG. 5B) shifts to the right, increasing pixel intensity due to dark current. In addition, the variance of the pixel intensity increases, due to increased thermal noise.

To summarize, the following insights can be drawn for near-sensor processing:

Near-sensor processing architectures promote system energy-efficiency, but also increase sensor element 14 temperature.

Raised sensor element 14 temperatures aggravate thermal noise.

Transient sensor element 14 junction temperatures crucially determine fidelity.

Smaller (ms) sensor element 14 junction time constants facilitate immediate drop in temperature allowing on-demand high fidelity.

Fidelity needs are highly dynamic, depending on environmental factors such as lighting and ambient temperature.

Imaging demands more fidelity than other vision applications.

These observations motivate the need for novel dynamic thermal management strategies for near-sensor processing at sufficient vision and imaging fidelity.

Figure 6:
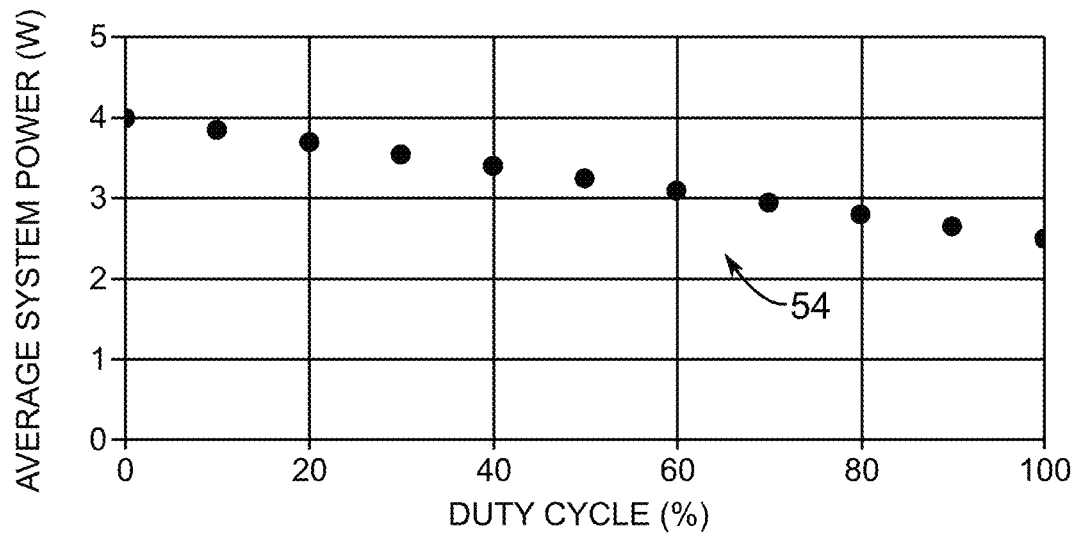
FIG. 6 is a graphical representation of power consumption of an exemplary embodiment at various duty cycles between near-sensor processing (NSP) mode and capture (CAP) mode.
Figure 7:
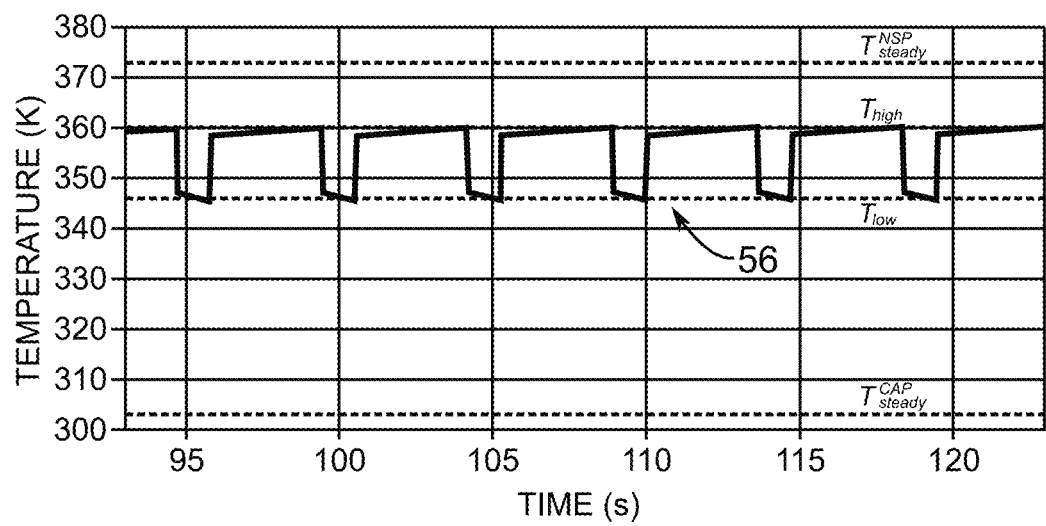
FIG. 7 is a graphical representation of a transient response of a seasonal migration policy with a 77% duty cycle to confine sensor element temperature within thermal boundaries.

With reference to FIGS. 6 and 7, imaging-specific control policies for thermal management can build on these characterized challenges and opportunities. The characterization described above shows that near-sensor processing increases system energy efficiency, but sacrifices image fidelity due to raised sensor element 14 temperatures. This raises a natural question: Can near-sensor processing be leveraged to create efficiency benefits while maintaining sufficient image fidelity for vision and imaging tasks? Driven by this, an exemplary aspect disclosed herein applies novel control policies that can efficiently regulate sensor element 14 temperature for continuous and on-demand image fidelity needs. These control policies can be governed by a runtime controller, which is referred to herein as Stagioni.

Dynamic thermal management (DTM) for microprocessors is a mature research area. However, traditional processor DTM mechanisms are not designed to suit imaging needs. Rather than simply being limited by TDP, image fidelity is impaired by the immediate transient sensor element 14 temperature during image capture. Furthermore, thermal management for near-sensor processing should adapt to the situational needs of the vision/imaging application, such as by allowing higher temperatures when in brighter environments and rapidly dropping temperature when high fidelity is required.

To account for near-sensor processing temperature management, an exemplary aspect modifies traditional DTM techniques to introduce two potential control policies that quell image quality concerns, while striving to optimize for system power and performance. The first exemplary control policy, stop-capture-go, temporarily halts near-sensor processing for temperature regulation and on-demand high fidelity capture. The second exemplary control policy, seasonal migration, occasionally migrates the processing to a thermally isolated remote processing unit (e.g., SoC 28) for temperature regulation and on-demand high fidelity captures.

Principles for Managing Sensor Temperature:

To design control policies for thermal management that are effective for near-sensor processing, three core principles are introduced. Under the first principle, situational temperature regulation, the control policy should confine sensor element 14 temperature within a threshold that suffices for imaging fidelity needs. Under the second principle, on-demand fidelity, upon application request the control policy should quickly drop the temperature to a desired capture temperature for high fidelity imaging. Under the third principle, system power minimization through duty cycle, the duty cycle governs system efficiency. These principles are discussed in more detail below.

As discussed above, vision tasks have varying fidelity needs, which are sensitive to camera settings (e.g., ISO and exposure) and lighting situation (e.g., bright conditions). This translates directly to temperature requirements, resulting in a simple upper bound:

$$T_{sensor} < T_{vision} \quad \text{Equation 1}$$

Thus, temperature management must be cognizant and respectful of immediate vision task requirements in situational conditions to provision for effective vision accuracy.

While vision processing can operate on low fidelity images, certain applications may require high fidelity images on demand, such as life logging capture after object detection. Such capture must be immediate, before the object leaves the view of the camera. Fortunately, as characterized above with respect to FIGS. 3A and 3B, sensor element 14 temperature rapidly drops with the removal of near-sensor power, such as by entering CAP mode. For example, when the 3D stacked vision sensor 20 drops its near-sensor power consumption from 2.5 W to 100 mW the sensor element 14 drops in temperature by 13.2° C. The time it takes the temperature to reduce by 98% of the drop is defined as $time_{jump} = 4 \times RC_{die}$. In some examples, the $time_{jump}$ amounts to 20 ms. Temperature management can leverage this drop to provision for on-demand high fidelity.

This temperature drop is directly proportional to the disparity between the near-sensor power before and after power reduction: $T_{jump} = \alpha(P_{NSP} - P_{CAP})$. For a modeled 3D stacked vision sensor 20, it is experimentally found that every 1 W of power causes a 5.5° C. temperature jump (e.g., $\alpha = 5.5°$ C./W). When constrained by a latency deadline (e.g., to immediately capture a moving object or to meet a synchronization deadline), the achievable jump within the latency deadline is a fraction of the time it takes to drop: $T_{jump}^{latency} = T_{jump} \times (e^{-t_{latency}/RC_{die}})$. Thus, to provision for predicted fidelity needs and latency needs of an application, the temperature management control policy can set reduced bounds:

$$T_{sensor} < T_{imaging} + T_{jump}^{latency} \quad \text{Equation 2}$$

FIG. 6 is a graphical representation of power consumption 54 of an exemplary embodiment at various duty cycles between NSP mode and CAP mode. While removal of processing power from the 3D stacked vision sensor 20 can effectively regulate temperature and provide on-demand high fidelity captures, the scheduling of operations should also strive to optimize for average system power. This can be characterized through the duty cycle and frequency of switches between the NSP and CAP modes. For duty cycle d, switching frequency $f_{switch}$ and energy per switch $E_{switch}$, average system power can be modeled as:

$$P_{avg} = d \times P_{NSP}^{system} + (1-d) \times P_{CAP}^{system} + f_{switch} \times E_{switch} \quad \text{Equation 3}$$

In minimizing average power, there is a notable tradeoff between the duty cycle and the frequency of switches. Spending more time in CAP mode allows the sensor element 14 to cool down, as does decreasing the length of time spent in NSP mode. This can also reduce the number of switches. On the other hand, spending less time in CAP mode allows the 3D stacked vision sensor 20 to spend a greater proportion of time in NSP mode, promoting energy savings through the duty cycle, at the expense of a larger number of switches. Notably, the time spent in each mode must be a multiple of the time spent capturing an image. In some cases it may not be possible to switch to CAP mode for a partial frame duration while an image is being captured. As shown in FIG. 6, for this implementation, which has minimal switching overhead, higher duty-cycles tend to provide favorable average system power profiles.

Stop-Capture-go for Near-Sensor Processing:

The traditional stop-go DTM technique regulates processor temperature by halting execution through clock gating. For near-sensor processing, the 3D stacked vision sensor 20 can be similarly placed in CAP mode, gating near-sensor units for some time before resuming NSP mode. The resulting "temporal slack" allows the 3D stacked vision sensor 20 to regulate capture fidelity at the expense of task performance. Stop-go techniques are architecturally simple, requiring only the ability to gate (e.g., enable and disable) the clock or power of various components.

Unlike traditional stop-go, the proposed stop-capture-go policy requires unique modifications to be sensitive to near-sensor processing tasks. First, frequently clock gating the entire 3D stacked vision sensor 20 is not advisable: interruptions to the camera pipeline create substantial capture delays on the order of multiples of frames. Instead, the system will clock gate (e.g., disable a system clock) the near-sensor VPU 22 and memory 24, placing the 3D stacked vision sensor 20 into CAP mode. Second, rather than being governed by TDP, the temperature regulation will trigger as the sensor element 14 reaches a situational upper bound specified by the principles, such that $T_{sensor} < T_{vision}$ and $T_{sensor} < T_{imaging} + T_{jump}^{latency}$. Third, the execution halt can be triggered by the controller to achieve on-demand fidelity upon application request. For this, the 3D stacked vision sensor 20 simply enters CAP mode to retrieve the requested frame.

The amount of "stop" time (the amount of time the processor is halted) is an important policy parameter under stop-capture-go. During the stop time, the system will "drop" frames, failing to process them. Elongated stop times allow a sensor element 14 to cool down further, which reduces the number of switches. For vision tasks, stop times can be detrimental, as contiguously dropped frames may contain important ephemeral visual information. Thus, if a system wishes to prioritize a continuity of visual information, stop time should be reduced. In the simulated study, it is found that the minimal stop time of 33 ms (one frame time) is sufficient to cool down the sensor element 14 from 87° C. to 74° C., enabling sufficient continuous temperature regulation and on-demand fidelity.

Due to the architectural simplicity of the stop-capture-go policy, the system overhead is minimal, promoting a continuously low system power. However, frequent frame drops will impair the visual task performance. Thus, stop-capture-go is suitable for systems that demand low power but are not performance-critical and/or systems that require minimal architecture modifications.

Seasonal Migration:

While stop-capture-go is a simple policy for temperature regulation and high-fidelity captures, it degrades application performance by halting execution. Towards minimizing performance loss, seasonal migration for near-sensor processing is investigated. The seasonal migration policy shifts the processing to a thermally isolated computational unit, allowing continuous computing. As modeled above, spatial thermal isolation between the 3D stacked vision sensor 20 and a remote processing unit (e.g., SoC 28) allows thermal relief.

Enabling seasonal migration comes at the expense of duplicated computational units near to and far from the sensor element 14, but effectively regulates sensor element 14 temperature without sacrificing task performance.

FIG. 7 is a graphical representation of a transient response 56 of the seasonal migration policy with a 77% duty cycle to confine sensor element 14 temperature within thermal boundaries. As illustrated in FIG. 7, the process for seasonal migration is governed by two temperature limits: $T_{high}$ and $T_{low}$. In an efficiency phase, triggered when the sensor element 14 reaches a temperature below $T_{low}$, the 3D stacked vision sensor 20 will enter NSP mode, performing near-sensor processing for system efficiency. In a cooling phase, triggered when the 3D stacked vision sensor 20 reaches a temperature above $T_{high}$, the 3D stacked vision sensor 20 will enter CAP mode, performing off-sensor processing on the remote processing unit (e.g., SoC 28), allowing the sensor element 14 to cool down. The alternation between these phases allows the system to balance efficiency with sensor element 14 temperature. For on-demand fidelity, the system simply enters the cooling phase regardless of current sensor element 14 temperature.

$T_{high}$ and $T_{low}$ are important policy parameters for the seasonal migration policy, controlling the balance of efficiency and temperature. $T_{high}$ forces the sensor element 14 temperature regulation, and thus should be set to shift to situational needs:

$$T_{high} = \min(T_{vision}, T_{imaging} + T_{jump}^{latency})$$

Meanwhile, the gap between $T_{high}$ and $T_{low}$ controls the system efficiency implications of the policy. Because it takes more time for the sensor element 14 temperature to bridge a larger gap, larger gaps decrease the frequency of switches, while smaller gaps increase the frequency of switches. The $T_{high}$-$T_{low}$ gap also controls the duty cycle of the system. When the desired sensor element 14 temperature range is closer to steady-state NSP temperature than steady-state CAP temperature, smaller gaps produce favorable duty cycles, spending more time in NSP mode. A shown in Equation 3 above, the average system power is a function of this duty cycle, balanced against the energy overhead and frequency of switches. Thus, $T_{low}$ should be chosen to create a gap that optimizes average system power.

As defined earlier, the duty cycle is the proportion of time spent in NSP mode. For the seasonal migration policy, the relationships can be derived from standard charging models. After the rapid drop or rise in temperature $T_{jump}$, which takes approximately $time_{jump}$ amount of time, the 3D stacked vision sensor 20 follows an RC charging curve towards the steady state temperature of the NSP or CAP mode. Altogether, this can be used to analytically model duty cycle d and frequency of migration $f_{migration}$.

$$time_{warming} = RC \times \ln\left(\frac{T_{steady}^{NSP} - (T_{low} + T_{jump})}{T_{steady}^{NSP} - T_{high}}\right) + time_{jump} \quad \text{Equation 4}$$

$$time_{cooling} = RC \times \ln\left(\frac{(T_{high} - T_{jump}) - T_{steady}^{CAP}}{T_{low} - T_{steady}^{CAP} - T_{jump}}\right) + time_{jump} \quad \text{Equation 5}$$

$$d = time_{warming}/(time_{warming} + time_{cooling}) \quad \text{Equation 6}$$

$$f_{migration} = 2/(time_{warming} + time_{cooling}) \quad \text{Equation 7}$$

Depending on implementation, the seasonal migration policy could suffer from switching latency and energy overhead resulting from state transfer and synchronization in shifting processing from one computational unit to another. However, reducing this migration overhead is a well-studied problem in distributed systems. Several reported techniques mitigate migration latency (e.g., pre-copy-based migration), which promote smooth execution performance while incurring energy overhead by keeping both computational units on while preparing for migration. Similarly, in this implementation, prior to migration, the system is prepared by preemptively starting up the target computational unit and initiating its context so it is prepared for execution.

Figure 8A:
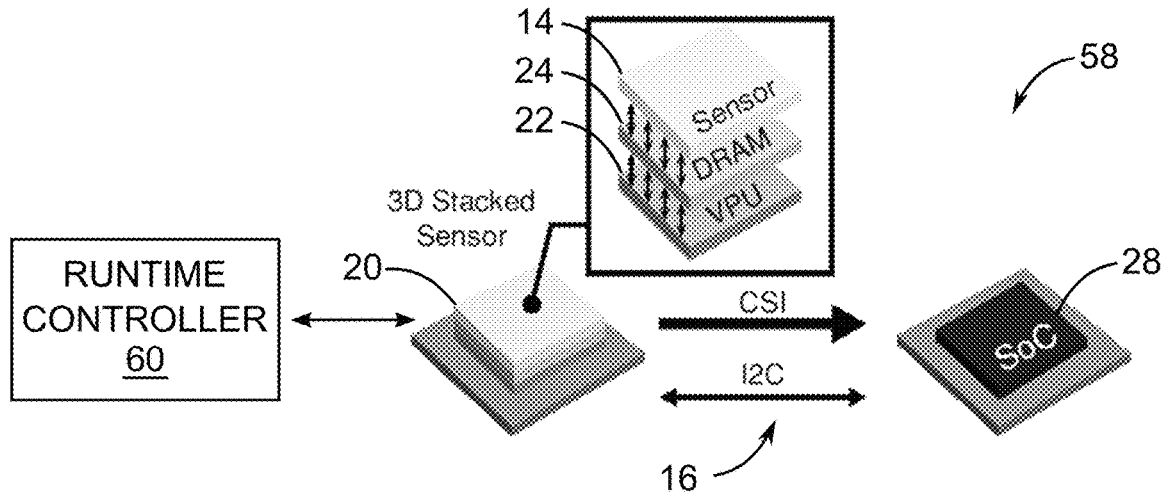
FIG. 8A is a schematic diagram of an exemplary vision system which includes a runtime controller for ensuring image fidelity.

FIG. 8A is a schematic diagram of an exemplary near-sensor vision system 58 which includes a Stagioni runtime controller 60 for ensuring image fidelity. The near-sensor vision system 58 is similar to the near-sensor vision system 18 of FIG. 1B, with the 3D stacked vision sensor 20 connected to and thermally isolated from a remote processing unit (e.g., the SoC 28).

An exemplary aspect proposes the Stagioni runtime controller 60 to execute the control policies at runtime. The runtime controller 60 is responsible to guarantee the fidelity demands of the application, coordinating state transfer between the operating modes of the 3D stacked vision sensor 20 to ensure smooth transition. The runtime controller 60 could be designed in a multitude of ways, e.g., a dynamically linked library, a runtime operating system (OS) service, or dedicated hardware. In an exemplary aspect, the runtime controller 60 is a runtime OS service that sits on the VPU 22 and/or the memory 24, allowing the remote processing unit (e.g., the SoC 28) to sleep. In some examples the VPU 22 also hosts the application context, though this is not required. Many existing migration controller designs would sufficiently and equivalently serve the purposes of decision-making. An exemplary set of modules that would achieve the goals is described below. Different aspects are discussed, including how the runtime controller 60 receives application inputs to meet fidelity demands.

Application Programming Interface (API) for Application-Specific Fidelity Needs:

A vision application only needs to provide three pieces of information to the controller: (1) continuous image fidelity requirement for vision, (2) on-demand image fidelity requirement for imaging, and (3) when to trigger on-demand fidelity. A simple API can enable developers to specify requirements from their applications. For example, a class may include the following methods:

setVisionSNR(float): specify continuous fidelity
setImagingSNR(float): specify on-demand fidelity
triggerOnDemandFidelity( ): request high fidelity The Stagioni runtime controller 60 translates expectations into effective thermal management, sidestepping any form of developer burden. To do this, the runtime controller 60 applies application-specific requirements into appropriate policy parameters through characterized device models. The runtime controller 60 also continuously adapts the policy parameters to situational settings, i.e., ambient temperature and ambient lighting, to meet ongoing quality requirements.

For example, based on a lower image fidelity requirement, the runtime controller 60 can operate in the NSP mode during at least a portion of an image capture operation (e.g., performing a vision task, capturing one or more images, capturing a video, etc.), up to operating at full NSP duty cycle during the image capture operation. However, during a subsequent image capture operation (e.g., capturing a higher quality image) the runtime controller 60 can receive a higher fidelity constraint from the vision application. This higher fidelity constraint can cause the runtime controller 60 to reduce the NSP duty cycle, or it may cause the 3D stacked vision sensor 20 to operate in the CAP mode throughout the subsequent image capture operation.

The runtime controller 60 orchestrates the execution pattern in runtime, which consists of several system-level events. For the stop-capture-go policy, the runtime controller 60 would use simple power gating mechanisms such as clock gating. For the seasonal migration policy, the runtime controller 60 would handle the communication between two chips (e.g., the VPU 22 and the SoC 28).

To this end, the runtime controller 60 can use simple message passing schemes to synchronize states between the 3D stacked vision sensor 20 and the host (e.g., the SoC 28). An exemplary scheme operates as follows: (i) The sensor element 14 temperature monitor detects a thermal trigger and raises an interrupt. (ii) The runtime controller 60 sends a signal to the remote processing unit (e.g., the SoC 28) controller to prepare for migration. (iii) In return, the remote processing unit controller starts the application and sends an acknowledgement to the source conveying that it is ready to accept the tasks. (iv) The runtime controller 60 then transfers application context data from the source's memory 24 to the host's memory (e.g., memory in or connected to the SoC 28). (v) Once the data transfer is done, both migration handlers notify their corresponding applications. The off-loaded tasks can now run in the new context loading the state from the memory. This sequence of steps can be scheduled prior to the migration event, such that immediate migration is possible.

Figure 8B:
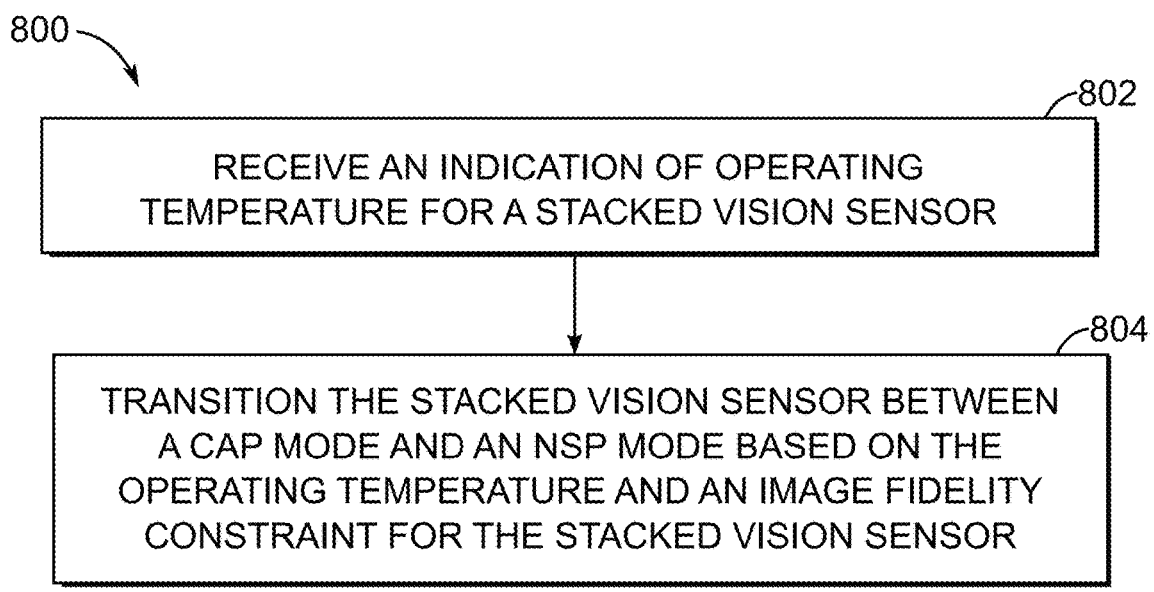
FIG. 8B is a flow diagram illustrating an exemplary process for thermally managing a vision system.

FIG. 8B is a flow diagram illustrating an exemplary process 800 for thermally managing a vision system. The process 800 begins at operation 802, with receiving an indication of operating temperature for a stacked vision sensor. The process 800 further includes operation 804, with transitioning the stacked vision sensor between the CAP mode and the NSP mode based on the operating temperature and an image fidelity constraint for the stacked vision sensor. The image fidelity constraint can be received form a vision application, as described above.

Exemplary control policies for the Stagioni runtime controller 60 have been implemented through simulation and emulation. The simulation framework is built around the characterized energy, noise, and thermal models described above. The simulation tool operates on these models and reports system metrics such as average system power, performance for different policy schedules. To practically realize the policies, an emulation platform is built around an FPGA. Stagioni is designed and implemented as a runtime controller 60 and integrated into the system to study execution patterns of different control policies.

Simulation Framework:

The simulation framework is built as a tool. The tool can be used to evaluate the thermal, energy, and noise of the near-sensor vision system 58 with the 3D stacked vision sensor 20 on the proposed control policies across a range of workloads. The tool takes device models and policy details as inputs and provides different system metrics as outputs while running sensor-driven applications. Users may wish to override default characterization models to suit their needs. In this case, users can provide vision task, camera settings, thermal policies to apply, and the desired capture temperature for images. The tool solves for the policy parameters such as rise and fall times that govern the control policies. Finally, the tool generates the temperature and fidelity traces and also reports the power and performance of the system.

Emulation Framework:

In addition to the simulation tool, an FPGA-based emulation platform is built on two ZCU102 boards. One of them emulates the 3D stacked vision sensor 20, while the other emulates the remote processing unit (e.g., the SoC 28). A 1 gigabit per second (Gbps) Ethernet is used for communication, simulating a standard CSI interface that has similar bandwidth characteristics.

Stagioni is designed around the CHaiDNN library. The Stagioni runtime controller 60 takes the type of control policy and its associated parameters as inputs. The parameters then generate a mode schedule that governs the task execution in runtime. The runtime controller 60 also handles high fidelity capture requests and services them to deliver high quality images through appropriate mechanisms. For the stop-capture-go policy, the execution of the neural network invocation is gated. For the seasonal migration policy, message passing over Ethernet is performed for state transfer and producer-consumer queues are implemented for synchronization.

With reference to FIGS. 9A-10B, the effectiveness of the control policies (e.g., stop-capture-go and seasonal migration) are evaluated for meeting fidelity demands while performing vision tasks of the case study. The near-sensor vision system 58 implementing these control policies can deliver up to 36% savings in average system power compared to the traditional vision system 10 with far-sensor processing (referred to as a full-far policy herein), for the case study. The savings primarily stem from maximizing near-sensor task operation. Furthermore, the savings varies with the fidelity requirements of the application. The policies achieve the savings by incurring a latency overhead of only 100 µs, which is negligible in comparison to ms-scale image capture times.

To evaluate different system metrics, the simulation and emulation frameworks described above are used.

Vision Tasks:

Image classification for the vision task is studied, identifying objects in a scene. The control policies are evaluated on the GoogLeNet ConvNet, modified to use 16-bit quantized weights for efficiency. In addition, the control policies are evaluated on other vision tasks, such as you only look once (YOLO)-based object detection with identical findings, omitted for brevity.

Metrics and Policies:

The major objective for evaluating a control policy is: effectiveness in regulating sensor element 14 temperature for capture fidelity, while optimizing power of the near-sensor vision system 58 with minimal performance overhead. Signal-to-noise ratio (SNR) is used to gauge image quality and frame drops for performance overhead. In addition to the stop-capture-go policy and seasonal migration policy, a full-far policy (the status quo) is considered for comparison.

Environment Conditions:

A wide range of lighting conditions are evaluated, from bright outdoor to dark indoor environments. Such lighting translates into different camera settings (e.g., exposure and ISO). The flexible CapraRawCamera camera app is used to automatically determine appropriate camera settings based on the scene lighting. The following camera settings for three sensor illuminations are used.

Outdoor daylight (32000 lux): Exp.=16 ms, ISO=100

Indoor office light (320 lux): Exp.=32 ms, ISO=400

Dimly lit office light (3.2 lux): Exp.=64 ms, ISO=800

For evaluating ambient temperature effects, a 20° C. to 40° C. range is used, representing cool indoor to hot outdoor situations.

Figure 9A:
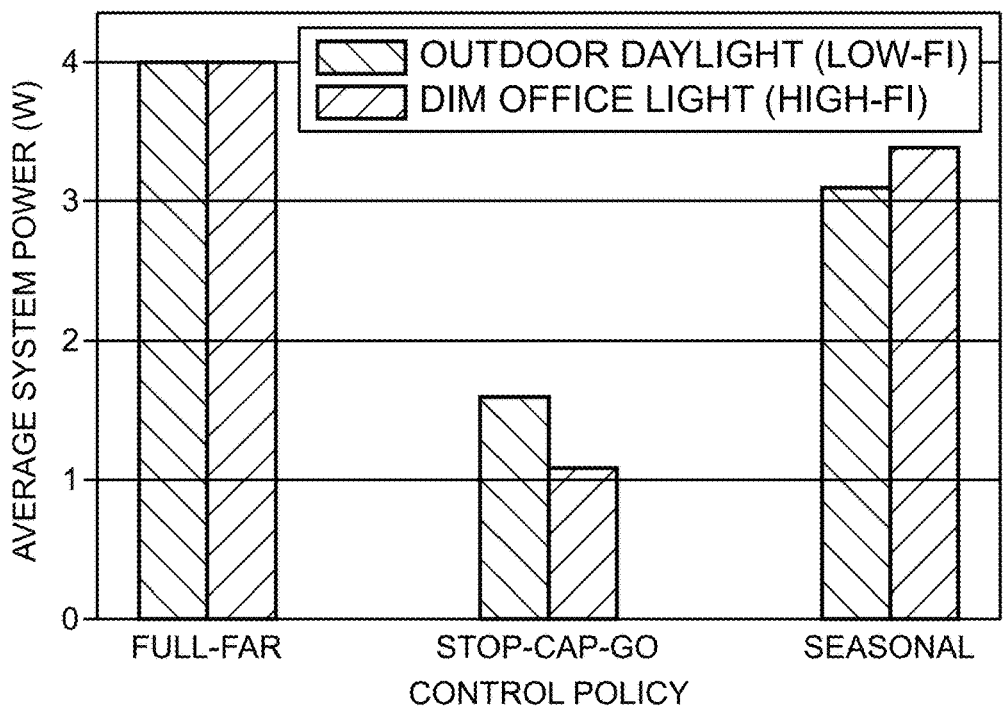
FIG. 9A is a graphical representation of average system power for different control policies for different application fidelity needs.
Figure 9B:
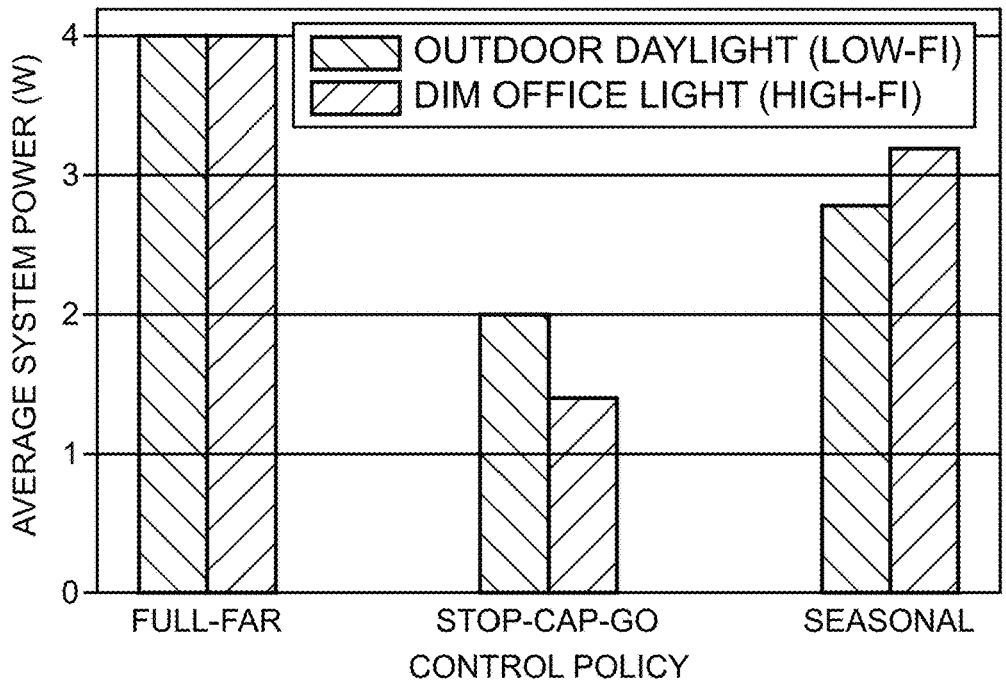
FIG. 9B is a graphical representation of average system power for different control policies under different lighting conditions.

FIGS. 9A and 9B illustrate power impact of the stop-capture-go, seasonal migration, and full-far policies. The stop-capture-go and seasonal migration policies substantially reduce system power compared to the full-far policy (status quo). Average system power largely depends on duty cycle. Naturally, maximal power savings can be obtained by operating at a maximum duty cycle. However, the achievable duty cycle is limited by the placement of thermal boundaries. The thermal boundary placement determines the steepness or gradualness of warming and cooling phases. Thermal boundaries closer to the steady-state temperature of the warming phase results in higher duty cycles. The fidelity requirements, dictated by application and ambient situation, decide the placement of thermal boundaries. High fidelity expectations result in lower thermal boundaries, and therefore, lower duty cycles. Here the implication of different fidelity requirements on system power is evaluated.

FIG. 9A is a graphical representation of average system power for the different control policies for different application fidelity needs. Stop-capture-go consumes the lowest amount of power among all the control policies. This is because the stop-capture-go policy operates entirely on the near-sensor VPU 22 for whole program execution in both NSP and CAP modes. In contrast, the seasonal migration policy operates on the remote processing unit (e.g., the SoC 28) during CAP mode and on the near-sensor VPU 22 during NSP mode. So, it consumes more power than the stop-capture-go policy but less than the full-far policy, which always operates on the remote processing unit.

System power changes with fidelity demands, due to change in duty cycle; high fidelity pulls down the duty cycle, reducing efficiency. This is evident in simulations of the seasonal migration policy; higher power for high app fidelity is achieved in comparison to the power with low app fidelity. Meanwhile, for the stop-capture-go policy, a lower duty cycle increases VPU 22 sleep time. Therefore, power decreases while moving from low to high app fidelity. Finally, for the full-far policy, there is no change in system power as it doesn't create fidelity issues.

FIG. 9B is a graphical representation of average system power for different control policies under different lighting conditions. Similar trends are observed for various control policies with fidelity changes forced by lighting, as illustrated in FIG. 9B. Here outdoor daylight behaves similarly to a low fidelity case, while indoor dimly lit office light behaves similar to a high fidelity case.

Policy Execution Overhead:

While the near-sensor vision system 58 executes the seasonal migration policy, it switches between the near-sensor VPU 22 and the remote processing unit (e.g., the SoC 28), incurring an overhead. Switching overhead strongly relates to the number of frame drops. From the emulation setup, the switching overhead is 100 µs, which is much less than frame capture/inference times (33 ms). Therefore, the seasonal migration policy has negligible overhead and no impact on application performance.

For the stop-capture-go policy, stop time determines the number of frame drops. At the same time, lower stop times also promote higher efficiency through higher duty cycles. Furthermore, the sufficient temperature drop can be achieved in less than a frame period. Therefore, the system can operate at the minimum stop time (one frame time) for efficiency reasons.

Figure 10A:
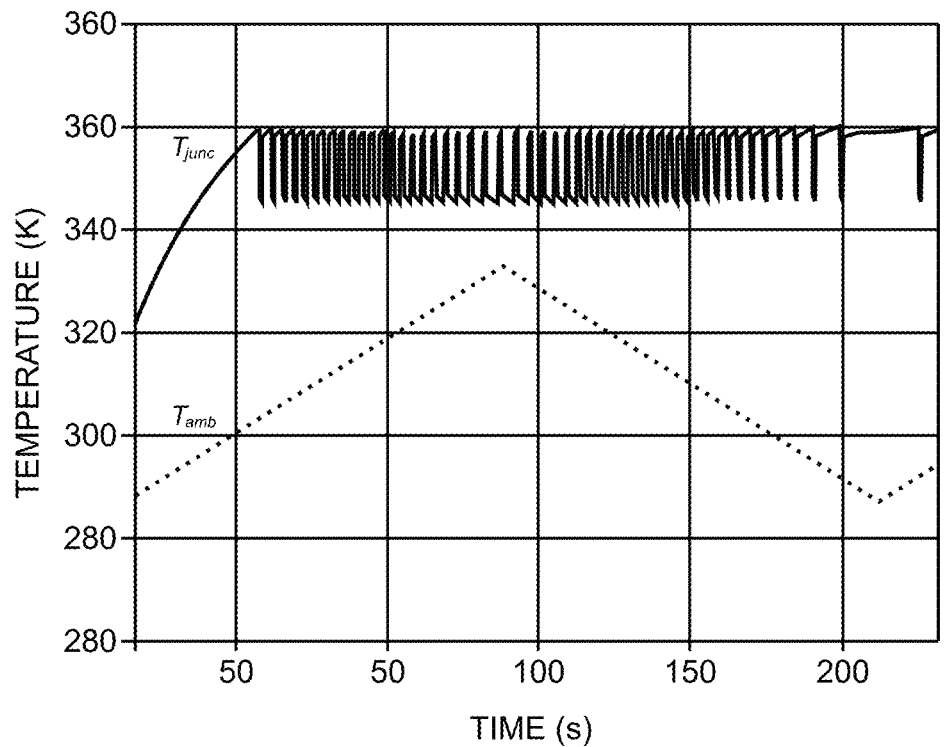
FIG. 10A is a graphical representation of warming and cooling times as a function of changes in ambient temperature.
Figure 10B:
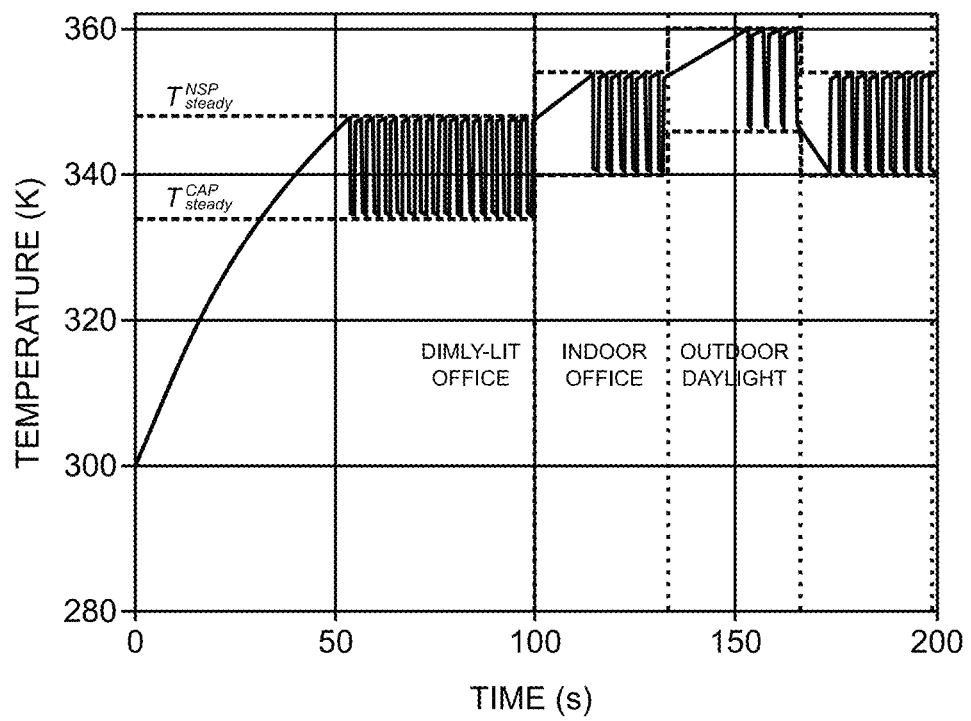
FIG. 10B is a graphical representation of warming and cooling times as a function of changes in lighting conditions.

FIGS. 10A and 10B illustrate situational awareness features to dynamic ambient settings of the Stagioni runtime controller 60. The runtime controller 60 smoothly adapts thermal boundaries to match ambient temperature and lighting situations.

FIG. 10A is a graphical representation of warming and cooling times as a function of changes in ambient temperature. Ambient temperature determines steady-state temperatures, which determine the warming and cooling times. Higher ambient temperatures push $T_{steady}^{NSP}$ far from $T_{low}$ and push $T_{steady}^{CAP}$ close to $T_{high}$. This forces the warming phase to take a steeper rise and the cooling phase to take a gradual fall in the exponential curve. Thus, increasing ambient temperature decreases duty cycle and vice-versa. The change in ambient temperature in the emulation platform is simulated, as shown in FIG. 10A. Decreasing ambient temperature increases rise times and reduces fall times in the simulated temperature trace. In addition, the runtime controller 60 smoothly adjusts to the changes in ambient temperature.

FIG. 10B is a graphical representation of warming and cooling times as a function of changes in lighting conditions. Lighting dictates fidelity requirements, changing $T_{high}$ and $T_{low}$. Again, the runtime controller 60 adapts to these changes with light variation. Change in illumination is simulated to generate a trace with random juggling between lighting scenarios. This trace is provided as an input to the runtime controller 60 and the temperature trace is collected. FIG. 10B shows the temperature trace overlaid with $T_{high}$ and $T_{low}$. Smooth variation of temperature with changes in light intensity can be observed.

Table 3 lists the power profile of several VPU 22 choices. The VPU 22 power profile determines the extent to which the near-sensor vision system 58 can leverage near-sensor processing. For the low power profiles that do not degrade fidelity (e.g., Eyeriss+EIE), tasks on the 3D stacked vision sensor 20 can be fully executed (e.g., at 100% duty cycle). For VPUs 22 that cause fidelity issues (e.g., Neurostream), the Stagioni runtime controller 60 enables near-sensor processing to leverage energy-efficiency benefits, determining duty cycles to maximize power savings.

TABLE 3

This table shows the rough estimates of near-sensor system power profiles of different VPUs and savings compared to status quo. For power profiles without temperature issues, we can perform near-sensor processing for entire program execution, i.e. 100% duty cycle, to achieve maximum system savings. For the rest, Stagioni optimizes duty cycle based on fidelity needs.

| Architecture | Vision ConvNet | Frame Rate (fps) | Comp. Power (W) | Trad. Sys. Power (W) | NSP Sys. Power (W) | Duty Cycle (%) | Avg. Sys. Power (W) | Savings (%) |
|---|---|---|---|---|---|---|---|---|
| Eyeriss + EIE [16, 23] | AlexNet | 35 | 0.9 | 2.71 | 1.0 | 100 | 1 | 63 |
| Myriad 2 [38] | GoogLeNet | 3 | 1.3 | 1.45 | 1.31 | 77 | 1.34 | 8 |
| Neurostream [12] | ResNet50 | 34 | 2.5 | 4.25 | 2.59 | 66 | 3.16 | 26 |

TABLE 3-continued

This table shows the rough estimates of near-sensor system power profiles of different VPUs and savings compared to status quo. For power profiles without temperature issues, we can perform near-sensor processing for entire program execution, i.e. 100% duty cycle, to achieve maximum system savings. For the rest, Stagioni optimizes duty cycle based on fidelity needs.

| Architecture | Vision ConvNet | Frame Rate (fps) | Comp. Power (W) | Trad. Sys. Power (W) | NSP Sys. Power (W) | Duty Cycle (%) | Avg. Sys. Power (W) | Savings (%) |
|---|---|---|---|---|---|---|---|---|
| NeuFlow [39] | N/A | 30 | 6 | 7.55 | 6.08 | 55 | 6.74 | 11 |
| TK1 [15] | N/A | 10 | 6.6 | 7.12 | 6.63 | 80 | 6.72 | 5 |

Those skilled in the art will recognize improvements and modifications to the preferred embodiments of the present disclosure. All such improvements and modifications are considered within the scope of the concepts disclosed herein and the claims that follow. For example, a collection of significant extensions is envisioned to unlock the benefits of 3D stacked integration.

Fine-Grained Temperature Management:

The seasonal migration policy executes at coarse granularity, migrating the entire workload between near-sensor VPUs 22 and remote processing units (e.g., the SoC 28). Migration at a fine granularity (e.g., OpenVX task graph nodes) can help achieve fine-grained task migration towards precise temperature management and associated optimization.

Enhancing Near-Sensor Burst Performance:

Temperature management for near-sensor processing unlocks the ability to leverage near-sensor VPUs 22 for efficiency, but could also provide burst performance benefits under a temperature "budget". Adapting temperature management for burst performance would need a deeper semantic awareness of application workload requirements. For non-trivial workloads, this may require reactive programming or other sophisticated techniques to, for example, reconfigure on-demand sensor operations and expectations when the visual task requires it.

Stacked Sensor Architecture Design/Validation:

While implications of stacked sensor architectures are modeled and simulated, future efforts can include specifically designed stacked hardware. Tunable components and interfaces will be implemented and evaluated with different scenarios.

Near-sensor processing has a great potential towards energy-efficient imaging and vision, as demonstrated by recent academic and industrial efforts on stacked image sensors. However, doing so hampers sensor fidelity due to thermal noise, thereby limiting the adoption of near-sensor processing. The characterization reveals that immediate drop in temperatures can be realized within short duration. This observation is used to design principles for managing sensor temperature for efficient temperature regulation and high fidelity temperatures, while optimizing for system power. To implement the control policies, the Stagioni runtime controller 60 is designed and implemented to manage sensor temperature, while fulfilling imaging needs. This work is the first runtime solution for stacked sensor thermal management. This work will form the foundation for future imaging-aware DTM techniques.

What is claimed is:

1. A vision system, comprising:
   a stacked vision sensor operable in a capture (CAP) mode and a near-sensor processing (NSP) mode, the stacked vision sensor comprising:
      a sensor element configured to capture image data in the NSP mode and in the CAP mode;
      a vision processing unit (VPU) stacked with the sensor element and configured to:
         in the NSP mode, process the image data captured by the sensor element; and
         in the CAP mode, not process the image data captured by the sensor element; and
      a memory stacked with the sensor element and the VPU; and
   a runtime controller coupled to the stacked vision sensor and configured to:
      receive an image fidelity constraint from a vision application;
      detect an operating temperature of the stacked vision sensor; and
      provide thermal management of the sensor element by cycling the stacked vision sensor between the CAP mode and the NSP mode to control performance of the sensor element based on the image fidelity constraint and the operating temperature.

2. The vision system of claim 1, wherein during the CAP mode the runtime controller causes a system clock to be disabled for the VPU and the memory and enabled for the sensor element.

3. The vision system of claim 2, wherein during the NSP mode the system clock is enabled for the VPU and the VPU performs image processing tasks.

4. The vision system of claim 1, further comprising a remote processing unit thermally isolated from the stacked vision sensor.

5. The vision system of claim 4, wherein:
   during the CAP mode, an image processing function is disabled for the stacked vision sensor and transferred to the remote processing unit; and
   during the NSP mode, the image processing function is enabled for the stacked vision sensor.

6. The vision system of claim 4, wherein the remote processing unit is a system-on-chip (SoC) electrically connected to the stacked vision sensor.

7. The vision system of claim 1, wherein the runtime controller is further configured to provide the thermal management of the sensor element by changing a duty cycle of the stacked vision sensor between the NSP mode and the CAP mode based on the image fidelity constraint and the operating temperature of the stacked vision sensor.

8. The vision system of claim 7, wherein the runtime controller is further configured to:
   decrease the duty cycle of the NSP mode when the operating temperature exceeds a first threshold; and
   increase the duty cycle of the NSP mode when the operating temperature reaches a second threshold below the first threshold.

9. The vision system of claim 8, wherein the first threshold represents a maximum operating temperature at which the image fidelity constraint is met.

10. The vision system of claim 1, wherein when the runtime controller receives a lower image fidelity constraint for a first image capture operation, the runtime controller is configured to cause the stacked vision sensor to operate in the NSP mode during at least a portion of the first image capture operation.

11. The vision system of claim 10, wherein when the runtime controller receives a higher image fidelity constraint for a second image capture operation, the runtime controller is configured to reduce the operating temperature of the stacked vision sensor by causing the stacked vision sensor to operate in the CAP mode throughout the second image capture operation.

12. A method for thermally managing a stacked vision sensor comprising a sensor element stacked with a vision processing unit (VPU) and a memory, the method comprising:
receiving an image fidelity constraint for the stacked vision sensor from a vision application;
receiving an indication of operating temperature for the stacked vision sensor; and
cycling the stacked vision sensor between a capture (CAP) mode and a near-sensor processing (NSP) mode to control performance of the sensor element based on the indication of operating temperature and the image fidelity constraint, wherein:
in the NSP mode, the VPU processes image data captured by the sensor element; and
in the CAP mode, the VPU does not process the image data captured by the sensor element.

13. The method of claim 12, wherein cycling the stacked vision sensor to the CAP mode comprises disabling an image processing function of the stacked vision sensor and transferring the image processing function to a remote processing unit.

14. The method of claim 13, wherein cycling the stacked vision sensor to the NSP mode comprises enabling the image processing function of the stacked vision sensor.

15. The method of claim 12, wherein the cycling the stacked vision sensor between the CAP mode and the NSP mode comprises:
decreasing a duty cycle of the NSP mode relative to the CAP mode when the operating temperature exceeds a first threshold; and
increasing the duty cycle of the NSP mode relative to the CAP mode when the operating temperature reaches a second threshold below the first threshold.

16. Vision circuitry, comprising:
a stacked vision sensor, comprising:
a sensor element configured to capture image data;
a vision processing unit (VPU); and
a memory stacked with the sensor element and the VPU; and
a runtime controller coupled to the stacked vision sensor and configured to dynamically manage a temperature of the stacked vision sensor to control performance of the sensor element by selectively offloading image processing of the image data captured by the sensor element from the VPU to a remote processing unit based on the temperature of the stacked vision sensor and an image fidelity constraint received from a vision application.

17. The vision circuitry of claim 16, wherein the VPU is operable in:
a near-sensor processing (NSP) mode in which the VPU performs the image processing; and
a capture (CAP) mode in which the VPU offloads the image processing to the remote processing unit.

18. The vision circuitry of claim 17, wherein the runtime controller is configured to dynamically manage the temperature of the stacked vision sensor by controlling a duty cycle of the VPU between the NSP mode and the CAP mode.

19. The vision circuitry of claim 16, wherein the runtime controller is configured to dynamically manage the temperature of the stacked vision sensor to meet the image fidelity constraint and reduce power consumption of the vision circuitry.

* * * * *